(12) United States Patent
Wiese et al.

(10) Patent No.: US 8,232,541 B2
(45) Date of Patent: Jul. 31, 2012

(54) OPTICAL SENSORS THAT REDUCE SPECULAR REFLECTIONS

(75) Inventors: Lynn K. Wiese, Santa Clara, CA (US);
Nikhil Kelkar, Saratoga, CA (US);
Viraj Patwardhan, Milpitas, CA (US)

(73) Assignee: Intersil Americas Inc., Milpitas, CA (US)

( * ) Notice: Subject to any disclaimer, the term of this patent is extended or adjusted under 35 U.S.C. 154(b) by 419 days.

(21) Appl. No.: 12/499,723

(22) Filed: Jul. 8, 2009

(65) Prior Publication Data
US 2010/0258712 A1 Oct. 14, 2010

Related U.S. Application Data

(60) Provisional application No. 61/169,236, filed on Apr. 14, 2009, provisional application No. 61/218,867, filed on Jun. 19, 2009.

(51) Int. Cl.
*G02B 27/00* (2006.01)
*H01J 40/14* (2006.01)

(52) U.S. Cl. ........................................ 250/551; 250/239

(58) Field of Classification Search .................. 250/551, 250/221, 239; 257/80–82; 438/24, 25
See application file for complete search history.

(56) References Cited

U.S. PATENT DOCUMENTS

| | | | |
|---|---|---|---|
| 4,051,365 A * | 9/1977 | Fukuyama et al. | ........ 250/222.1 |
| 5,698,975 A | 12/1997 | Kayserman | |
| 5,783,815 A | 7/1998 | Ikeda | |
| 5,883,386 A | 3/1999 | Tsuyuki | |
| 6,369,380 B1 | 4/2002 | Hirai | |
| 6,541,762 B2 | 4/2003 | Kang et al. | |
| 6,977,645 B2 | 12/2005 | Brosnan | |
| 7,045,775 B2 | 5/2006 | Leong et al. | |
| 7,161,136 B1 | 1/2007 | Wenstrand et al. | |

(Continued)

FOREIGN PATENT DOCUMENTS

JP 2000-269544 9/2000

(Continued)

OTHER PUBLICATIONS

Aslami, "Proposal for Ambient Light Sensor & Proximity Sensor," Sharp Corporation, 2 pages, Aug. 7, 2008.

(Continued)

*Primary Examiner* — Thanh Luu
(74) *Attorney, Agent, or Firm* — Fliesler Meyer LLP

(57) ABSTRACT

An optical sensor device comprises a light source, a light detector, and an opaque light barrier including a first portion to block light from being transmitted directly from the source to the detector. A second portion of the light barrier extends from the first portion in a direction towards the light source, such that a portion of the second portion covers at least a portion of light emitting element(s) of the source, to reduce an amount of specular reflections, if a light transmissive cover plate were placed over the sensor. Additionally, a third portion of the barrier can extend from the first portion, in a direction towards to the detector, such that a portion of the third portion covers at least a portion of light detecting element(s) of the detector, to reduce an amount of specular reflections that would be detected by the detecting element(s) of the detector, if a light transmissive cover plate were placed over the sensor. Additionally, an off-centered lens can cover a portion of the light source.

29 Claims, 14 Drawing Sheets

U.S. PATENT DOCUMENTS

| | | | |
|---|---|---|---|
| 7,196,316 | B2 | 3/2007 | Chan et al. |
| 7,309,855 | B2 | 12/2007 | Nagasaka et al. |
| 7,362,419 | B2 | 4/2008 | Kurihara et al. |
| 7,485,842 | B2 | 2/2009 | Bich et al. |
| 7,486,386 | B1 | 2/2009 | Holcombe et al. |
| 7,785,024 | B2 | 8/2010 | Fujimori |
| 7,842,957 | B2 * | 11/2010 | Goh et al. .................. 257/82 |
| 8,035,079 | B2 * | 10/2011 | Hane .................. 250/231.13 |
| 2001/0035450 | A1 | 11/2001 | Mannhart et al. |
| 2003/0189213 | A1 | 10/2003 | Igaki et al. |
| 2005/0087681 | A1 | 4/2005 | Chin et al. |
| 2006/0158887 | A1 * | 7/2006 | Holder et al. .................. 362/341 |
| 2006/0180888 | A1 | 8/2006 | Tan et al. |
| 2006/0237540 | A1 | 10/2006 | Saxena et al. |
| 2006/0266938 | A1 | 11/2006 | Abela |
| 2007/0210267 | A1 * | 9/2007 | Ishii et al. .................. 250/559.36 |
| 2008/0006762 | A1 | 1/2008 | Fadell et al. |
| 2008/0296478 | A1 | 12/2008 | Hernoult |
| 2010/0181578 | A1 * | 7/2010 | Li et al. .................. 257/82 |
| 2010/0282951 | A1 | 11/2010 | Costello et al. |
| 2010/0327164 | A1 | 12/2010 | Costello et al. |

FOREIGN PATENT DOCUMENTS

| | | |
|---|---|---|
| JP | 2002-267498 | 9/2002 |
| JP | 2004-071734 | 3/2004 |
| JP | 2005-037451 | 2/2005 |
| WO | WO 2008126836 A1 * | 10/2008 |

OTHER PUBLICATIONS

Proximity Sensor, Lead (Pb) Free Product—RoHS Compliant, SFH 7741, Opto Semiconductors, pp. 1-13, Jan. 14, 2009.

Reflective Optical Switch, Lead (Pb) Free Product—RoHS Compliant, SFH 7740, Opto Semiconductors, pp. 1-13, Jan. 14, 2009.

Photo Sensor (Proximity/Ambient Light Sensor, Model No. GP2AP002A00F, Sharp Corporation, pp. 1-33, Oct. 27, 2008.

APDS-9800, Integrated Ambient Light and Proximity Sensor (Built-in LED), Prelim Datasheet (version 5), Avago Technologies, 22 pages, 2005.

International Search Report and Written Opinion for PCT/US2010/030606, mailed Nov. 16, 2010.

International Search Report and Written Opinion for PCT/US2010/030603, mailed Oct. 26, 2010.

APDS-9120, "Integrated Optical Proximity Sensors," Data Sheet, Avago Technologies, Mar. 24, 2010.

APDS-9801, "Digital Proximity and Analog Ambient Light Sensor," Avago Technologies, Sep. 6, 2010.

HSDL-9100, "Surface-Mount Proximity Sensor," Avago Technologies, Nov. 26, 2009.

"Avago Technologies Announces APDS-9120, Ultra-Thin Integrated Optical Proximity Sensor for Wide Range of Portable Consumer Electronic Devices and Personal Computers," Embedded System News .Com, http://embeddedsystemnews.com/avago-technologies-announces-apds-9120-ultra-thin-integrated-optical-proximity-sensor-for-wide-range-of-portable-consumer-electronic-devices-and-personal-computers.html, Jul. 1, 2009.

"Avago Technologies Announces APDS-9800, Ultra-Thin Integrated Sensor Module for Use in Mobile Phones," Embedded System News .Com http://embeddedsystemnews.com/avago-technologies-announces-apds-9800-ultra-thin-integrated-sensor-module-for-use-in-mobile-phones.html, Sep. 10, 2009.

Office Action dated Jan. 19, 2012, in U.S. Appl. No. 12/499,693.

Office Action dated May 19, 2011, in U.S Appl. No. 12/499,693.

Office Action dated May 16, 2012, in U.S Appl. No. 12/643,831.

Ambient Light Sensor, AL3005 Data Sheet, Lite-On Semiconductor Corp., pp. 1-21, accessed Nov. 17, 2009 (date unknown).

* cited by examiner

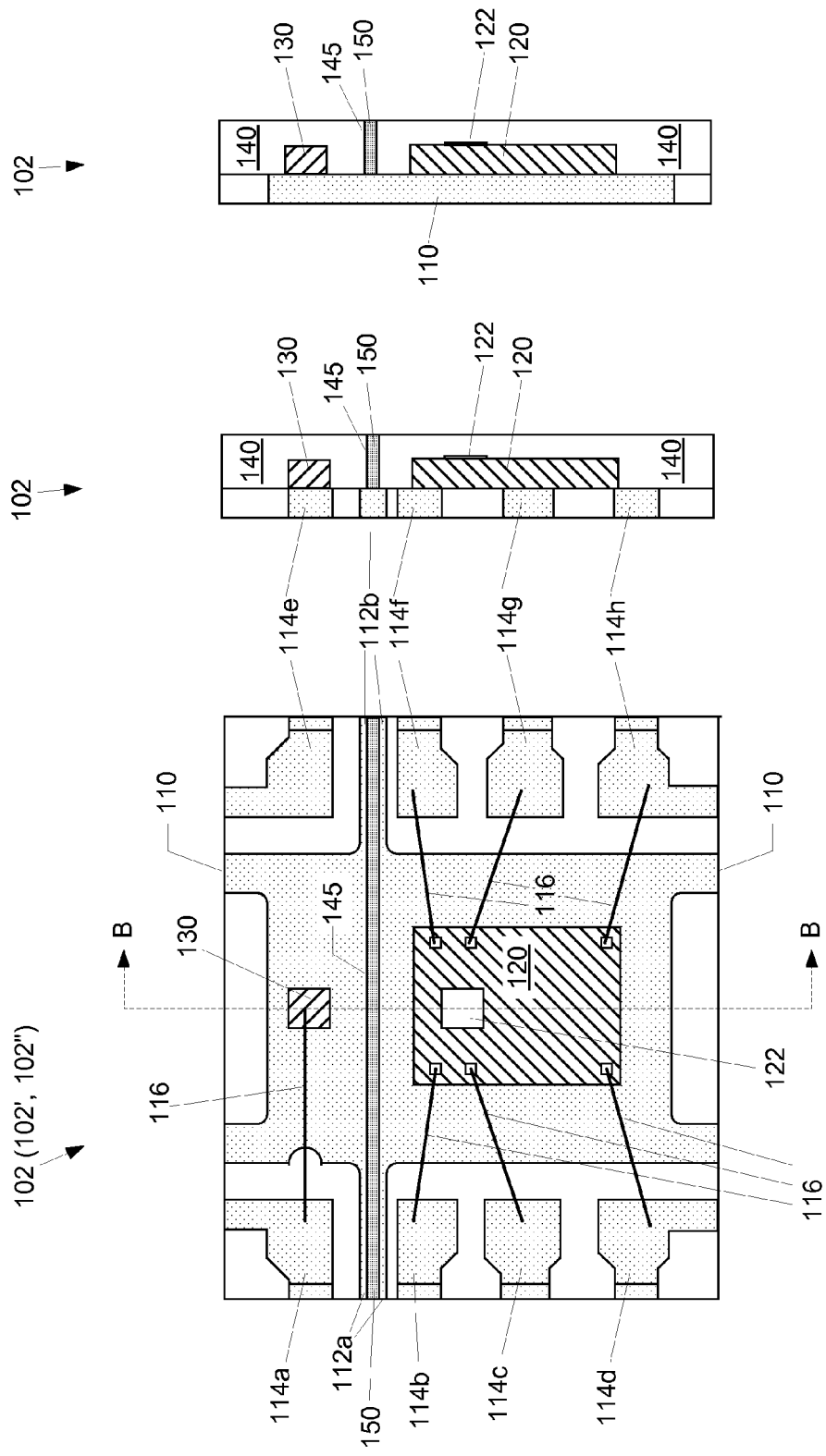

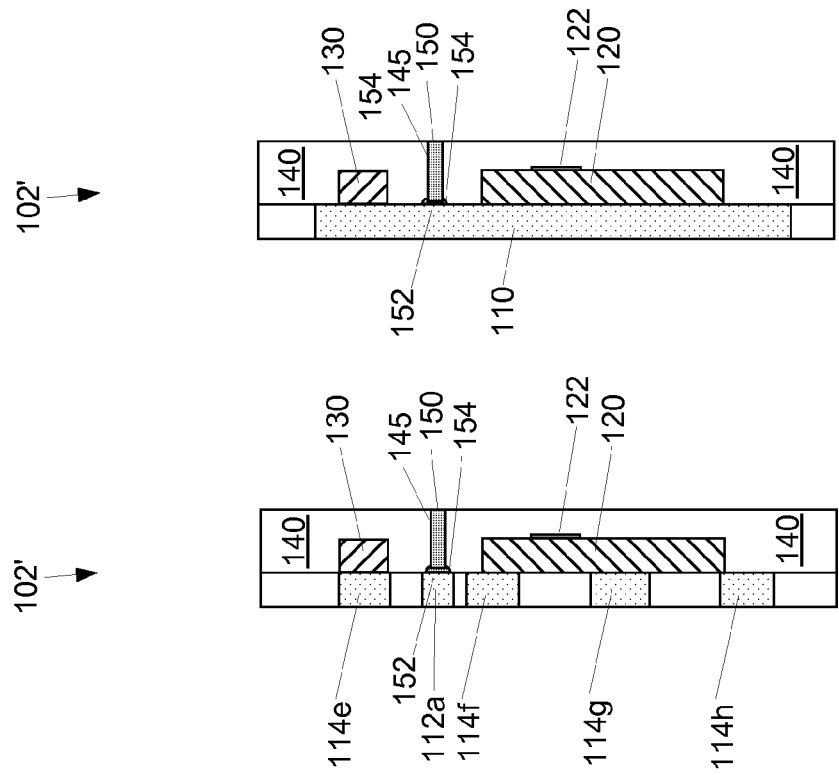
FIG. 3A (side view)
FIG. 3B (cross-section)

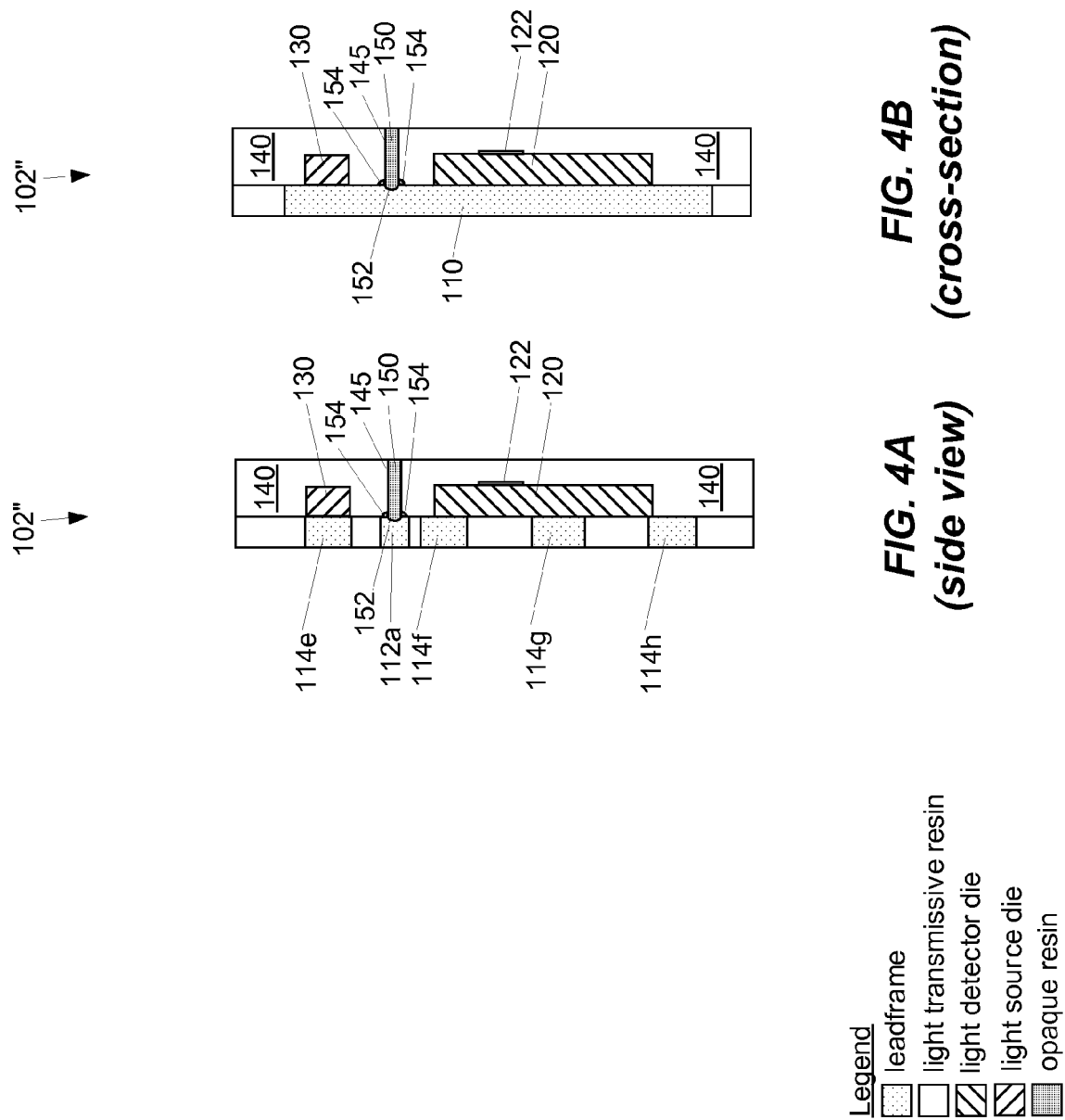
FIG. 4A (side view)
FIG. 4B (cross-section)

OPTICAL SENSORS THAT REDUCE SPECULAR REFLECTIONS

PRIORITY CLAIMS AND RELATED APPLICATION

This application claims priority under 35 U.S.C. 119(e) to U.S. Provisional Patent Application No. 61/169,236, entitled OPTICAL SENSORS AND METHODS FOR PROVIDING OPTICAL SENSORS, which was filed Apr. 14, 2009, and U.S. Provisional Patent Application No. 61/218,867, entitled OPTICAL SENSORS THAT REDUCE SPECULAR REFLECTIONS, which was filed Jun. 19, 2009, both of which are incorporated herein by reference.

This application is related to commonly invented and commonly assigned U.S. patent application Ser. No. 12/499,693, entitled OPTICAL SENSORS AND METHODS FOR PROVIDING OPTICAL SENSORS, which was filed on Jul. 8, 2009, and which is incorporated herein by reference.

BACKGROUND

Optical sensors, such as optical proximity sensors, may include one or more light emitting elements (e.g., LEDs) and an adjacent photosensitive light detector, where the sensor can estimate proximity of an object based on the magnitude of reflected light from the one or more LEDs returning to the sensor. The value of these sensors has become more important in the recent past with the advent of battery-operated handheld devices, such as mobile phones. For example, a fair amount of the energy from a mobile phone battery is used to drive the display, and there is value in turning off the display or backlight when the mobile phone or other device is brought to the user's ear (where it cannot be viewed anyway). Optical proximity sensors have been used for this, and many other applications.

For other examples, there are many other applications in which the presence of an object can be detected with an optical proximity sensor to advantage. These range from sensing when protective covers have been opened on machinery, paper has been positioned correctly in a printer, or an operator's hands are at risk near an operating machine. An optical proximity sensor can also be used as a simple touch or near-touch activated switch, and could be implemented in applications like keyboards or devices that have a plastic housing that is sealed but which allows the light from the source to pass through and be sensed by the detector on the return.

Light from the source to the detector that does not project out of the package to the target, but rather is transmitted directly from the source to the detector, reduces the capability of the overall device to sense distance. Such light essentially propagates sideways within the package and is considered noise or "light leakage", and contains no information. To reduce and preferably prevent light leakage, a light barrier is often used to isolate the light source from the light detector. However, current techniques for manufacturing optical proximity sensors are relatively complex, costly and often results in sensors that are larger than desired. Further, the optical proximity sensor components except the light source are often produced by one vendor, while the light source is produced by another vendor, resulting in the light source being installed separately from the rest of the components of the optical proximity sensor, which increases the overall footprint of the device, and the complexity and the cost of the assembly.

Optical sensors are often used with (e.g., placed behind or covered by) a cover plate that is glass, plastic, or some other protective light transmissive material. For example, the cover plate can be the glass covering a screen of a mobile phone, portable music player or personal data assistant (PDA), or the plastic covering a screen of a laptop computer. When such a cover plate is placed over an optical sensor, the optical sensor is often susceptible to specular reflections. Just as it is desirable to minimize light being transmitted directly from the source to the detector, it is also desirable to minimize the specular reflections because such reflections similarly reduce the capability of the overall device to sense distance, since specular reflections are essentially noise that contain no information.

SUMMARY

Many of the applications described above would benefit from a sensor of reduced form factor, with a simple structure that can be mass-produced at low cost. Embodiments of the present invention are believed to provide such simple and cost effective sensors. Further embodiments of the present invention reduce a sensor's susceptibility to specular reflections.

An optical sensor device, according to an embodiment, includes a light detector die and a light source die attached to the same or different die attachment substrates so that there is a space between the light source die and the light detector die. A light transmissive material (e.g., a clear epoxy) covers the light detector die, the light source die and at least a portion of the space between the light detector die and the light source die. A groove that is formed (e.g., saw, blade or laser cut, or cast) in the light transmissive material, between the light detector die and the light source die, is occupied by an opaque material (e.g., a black epoxy) that provides a light barrier between the light detector die and the light source die. Embodiments of the present invention are also directed to systems that include such an optical sensor device.

A method for providing an optical sensor device, according to an embodiment, includes attaching a light detector die and a light source die to the same or different die attachment substrate(s), so that there is a space between the light detector die and the light source die. The method also includes covering the light detector die, the light source die and the space between the light detector die and the light source die with a light transmissive material, as well as forming a groove in the light transmissive material between the light detector die and the light source die. Further, an opaque material is put (e.g., dispensed) within the groove to form a light barrier between the light detector die and the light source die.

Specific embodiments relate to a method for providing a plurality of optical sensor devices. The method includes attaching a plurality of light detector dies and a plurality of light source dies to one or more die attachment substrate(s) such that there is a predetermined amount of space between each one of the light detector dies and a corresponding one of the light source dies. The method also includes covering the light detector dies, the light source dies and the spaces therebetween with a light transmissive material, as well as forming grooves in the light transmissive material so that a groove is formed between each one of the light detector dies and the corresponding one of the light source dies. This can include forming the grooves by cutting into the light transmissive material, wherein each one of the cuts forms a groove between a plurality of the light detector dies and the corresponding light source dies. The grooves can alternatively be formed when the light transmissive material is formed, e.g., using features of a mold. The method also includes putting an opaque material within the grooves so that each one of the light detector dies and the corresponding one of the light source dies are separated by the opaque material. Additionally, the method includes cutting through the light transmissive material and the die attachment substrate(s), to which the light detector dies and the light source dies are attached, to thereby provide a plurality of separated optical sensor devices that each include one of the light detector dies and a corresponding one of the light source dies with a light barrier formed by the opaque material therebetween.

In accordance with a specific embodiment, an optical sensor device comprises a light source including one or more light emitting elements, a light detector including one or more light detecting elements, and an opaque light barrier. The opaque light barrier includes a first portion between the light source and the light detector. A second portion of the light barrier extends from the first portion of the light barrier, in a direction towards the light source, such that at least a portion of the second portion of the light barrier covers a portion of at least one of the one or more light emitting elements of the light source. The first portion of the light barrier is configured to block light from being transmitted directly from the light source to the light detector. The second portion of the light barrier is configured to reduce an amount of specular reflections, if a light transmissive cover plate were placed over the optical sensor device.

In an embodiment, the optical sensor device can also include a lens (e.g., a convex lens) covering at least a portion of the light source, where the lens is off-centered relative to a center of the one or more light emitting elements of the light source, such that the center of the lens is offset in a direction away from the first portion of the opaque light barrier. Such a lens is configured to reduce an amount of specular reflections that would be detected by the light detector, if a light transmissive cover plate were placed over the optical sensor device.

In accordance an embodiment, the opaque light barrier can also (or alternatively) include a portion (e.g., a third portion) that extends from the first portion of the light barrier, in a direction towards to the light detector, such that at least a portion of the third portion of the light barrier covers at least a portion of at least one of the one or more light detecting elements of the light detector. Such a third portion of the light barrier is configured to reduce an amount of specular reflections that would be detected by the one or more light detecting elements of the light detector, if a light transmissive cover plate were placed over the optical sensor device.

Embodiments of the present invention are also directed to methods for providing an optical sensor device that include the first portion and the second portion and/or third portion described above. In an embodiment, a method includes attaching a light detector to a substrate and attaching a light source to the same substrate to which the light detector is attached, or to another substrate, so that there is a space between the light detector and the light source. The light detector can include one or more light detecting elements, and the light source can include one or more light emitting elements. The method also includes forming an opaque light barrier having a first portion and a second portion, so that the first portion of the opaque light barrier is between the light detector and the light source, and so that at least a portion of the second portion of the light barrier covers at least a portion of at least one of the one or more light emitting elements of the light source.

A method can also include covering at least a portion of the light source with a lens that is off-centered relative to a center of the one or more light emitting elements of the light source, such that the center of the lens is offset in a direction away from the first portion of the opaque light barrier.

In an embodiment, the forming of the opaque light barrier also includes forming a third portion of the opaque light barrier that extends from the first portion of the light barrier, in a direction towards to the light detector, such that at least a portion of the third portion of the light barrier covers at least a portion of at least one of the one or more light detecting elements of the light detector.

This summary is not intended to summarize all of the embodiments of the present invention. Further and alternative embodiments, and the features, aspects, and advantages of the embodiments of invention will become more apparent from the detailed description set forth below, the drawings and the claims.

BRIEF DESCRIPTION OF THE DRAWINGS

FIG. 1 a top view of an optical sensor device (e.g., a proximity sensor device), according to certain embodiments of the present invention.

FIG. 2A is a side view of the device of FIG. 1, according to a first embodiment of the present invention.

FIG. 2B is a cross-sectional view of the device of FIGS. 1 and 2A, along dashed line B-B in FIG. 1, according to the first embodiment of the present invention.

FIG. 3A is a side view of the device of FIG. 1, according to a second embodiment of the present invention.

FIG. 3B is a cross-section view of the device of FIG. 1, along dashed line B-B in FIGS. 1 and 3A, according to the second embodiment of the present invention.

FIG. 4A is a side view of the device of FIG. 1, according to a third embodiment of the present invention.

FIG. 4B is a cross-section view of the device of FIGS. 1 and 4A, along dashed line B-B in FIG. 1, according to the third embodiment of the present invention.

DETAILED DESCRIPTION

Figure 5:
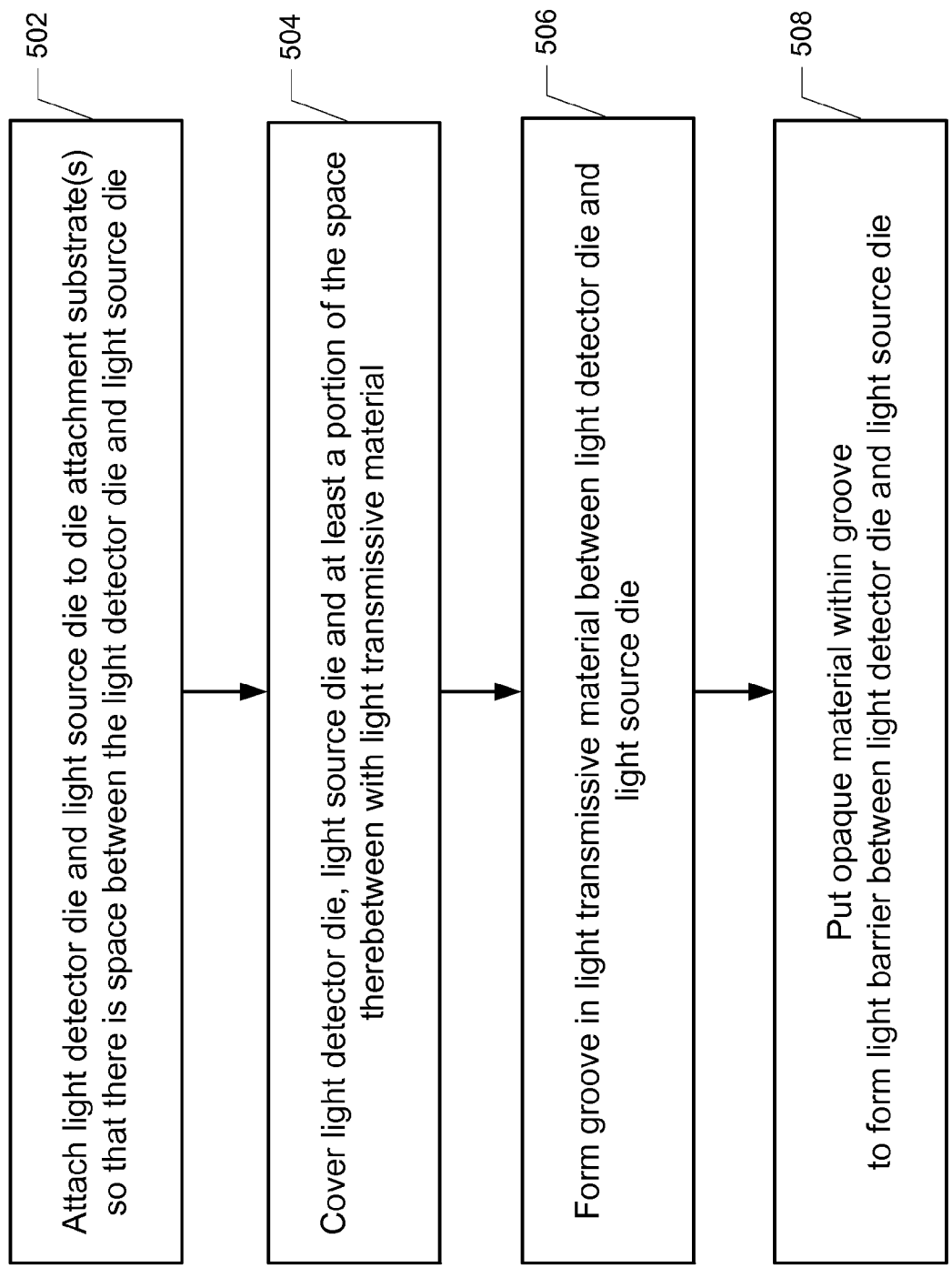
FIG. 5 is a high level flow diagram that is used to summarize various methods for providing an optical sensor device, in accordance with embodiments of the present invention.

FIG. 1 is a top view of an optical sensor device 102 (e.g., a proximity sensor device), according to specific embodiments of the present invention. FIG. 2A is a side view of the device 102 of FIG. 1, and FIG. 2B is a cross-sectional view of the device 102 of FIGS. 1 and 2A (along dashed line B-B in FIG. 1), according to a first embodiment of the present invention.

As shown in FIG. 1, the optical sensor device 102 includes a die attachment substrate 110, which in FIG. 1 is shown as being a die attachment leadframe substrate, but can alternatively be a circuit board substrate, or a ceramic substrate, but is not limited thereto. A benefit of using one or more leadframes as the die attachment substrate(s) is that a leadframe substrate can typically be made thinner than a circuit board substrate or a ceramic substrate, which can reduce the overall thickness of the device 102, which may be desirable, depending on the application in which the device 102 is used. For example, a leadframe substrate can have a thickness of about 0.2 mm, whereas a circuit board substrate would likely have a thickness of at least 0.3 or 0.4 mm. Further, a leadframe substrate provides for better heat dissipation than a circuit board substrate. Additionally, a leadframe substrate, if metallic, is opaque to light, whereas a typical circuit board substrate is somewhat light transmissive (unless a black circuit board is used, which is difficult to obtain). Also, a leadframe substrate is typically less expensive than a circuit board substrate and a ceramic substrate.

Attached to the die attachment substrate 110 is a light detector die 120 and a light source die 130. The light detector die 120 (which can also be referred to as a photosensor die, a photodetector die or an optical detector die) includes one or more light detecting elements, such as, but not limited to, a photoresistors, photovoltaic cells, photodiodes, phototransistors, charge-coupled devices (CCD), or the like, that can be used to produce a current or voltage indicative of the magnitude of detected light. The one or more light detecting elements form an active area 122 of the light detector die 120. While an exemplary location of the active area 122 relative to the remainder of the light detector die 120 is shown in the FIGS., alternative locations for the active area 122 are also within the scope of the present invention. For example, the active area 122 can be located further from (or closer to) the light source die 130 than is shown in the FIGS.

The light source die 130 (which can also be referred to as a light emitter die) includes one or more light emitting elements, such as, but not limited to, light emitting diodes (LEDs), organic LEDs (OLEDs), bulk-emitting LEDs, surface-emitting LEDs, vertical-cavity surface-emitting lasers (VCSELs), superluminescent light emitting diodes (SLEDs), laser diodes, pixel diodes, or the like. An LED type light source die 130 can include, for example, an n-type Silicon substrate with a p-type layer (e.g., a Gallium Arsenide (GaAs) layer) deposited on the n-type Silicon substrate. An electrode attached to the p-type layer provides one of the terminals of the LED die, and another electrode attached to the n-type substrate provides the other terminal of the LED die. The electrode attached to the p-type layer can be, or can be attached to, a wire bond (e.g., the wire bond 116 attached to the top of the light source die 130 in FIG. 1). The electrode attached to the n-type substrate can be, e.g., a conductive (e.g., silver) epoxy. For example, the conductive epoxy can attach the bottom of the n-type substrate to a die attachment leadframe substrate (e.g., 110 in FIG. 1).

The die attachment leadframe substrate 110 is shown as including leadframe arms 112a and 112b, that extend from the main body of the die attachment leadframe 110, and which can increase the light blocking capability of a light barrier that is formed in manners explained below. Also shown are leadframe bond pads 114a-h, that are electrically isolated from the die attachment leadframe 110, and wire bonds 116 that attach the light detector die 120 and the light source die 130 to the bond pads 114a-h.

As best seen in FIGS. 2A and 2B, a light transmissive material 140 covers the light detector die 120, the light source die 130 and the die attachment substrate 110 (except where a groove 145, discussed below, is formed). In accordance with specific embodiments, the light transmissive material 140 can be a light transmissive epoxy (e.g., a clear epoxy), or other light transmissive resin or polymer that is molded (e.g., transfer molded or cast molded) or otherwise formed over the light detector die 120, the light source die 130 and the die attachment substrate 110. A groove 145 (which can also be referred to as a channel) is formed in the light transmissive material between the light detector die and the light source die. The groove 145 can be saw cut, blade cut, or laser cut, or cut in another manner. Alternatively, the groove can be formed (e.g., cast) using a feature in the mold that is used to form the light transmissive material over the dies 120 and 130 and the space therebetween. For example, the groove 145 can be formed by a thin fin machined to project from a mold surface.

Within the groove 145 is an opaque material 150 that provides a light barrier between the light detector die and the light source die. In accordance with specific embodiments, the opaque material can be an opaque epoxy (e.g., a black epoxy) or other opaque resin or polymer that does not allow the wavelength(s) of light produced by the light emitter die 130 to pass therethrough. In other words, the light barrier, formed by the opaque material 150 within the groove 145, prevents light produced by the one or more light emitting elements of the light source die 130 from being transmitted directly to and detected by the one or more light detecting elements of the light detector die 120.

In accordance with an embodiment, the groove 145 is formed in the light transmissive material 140 preferably such that the groove 145 extends to the die attachment substrate 110, as shown in FIGS. 2A and 2B. If the groove 145 does not extend all the way to the die attachment substrate 110, the groove 145 should still be deep enough such that when the groove is occupied by the opaque material 150, an adequate light barrier is provided between the light source die 130 and the light detector die 120.

Reference is now made to FIGS. 3A and 3B, which are side and cross sections views respectfully of the light sensor device 102', according to a second embodiment of the present invention. In this embodiment, a strip of opaque material 154 is formed on the die attachment substrate 110, and the groove 145 is formed in the light transmissive material 140 such that the groove 145 preferably extends to or in the strip of opaque material 154. The strip of opaque material 154 can comprise the same opaque material as material 150, or a different material. In this embodiment, the strip 154 forms part of the light barrier between the light source die 130 and the light detector die 120. The strip 154 can be deposited and cured prior to the light transmissive material 140 being cast or otherwise formed.

Reference is now made to FIGS. 4A and 4B, which are side and cross sections views respectfully of the light sensor device 102", according to a third embodiment of the present invention. In this embodiment, a groove 152 is formed in the die attachment substrate 110 below where the groove 145 is formed (or more accurately, is thereafter formed) in the light transmissive material 140. As shown in FIGS. 4A and 4B, a strip of opaque material 154 is within the groove 152 and extends above a planar surface of the die attachment substrate 110. As also shown, the groove 145 formed in the light transmissive material 140 preferably extends to or into the strip of opaque material 154. In this embodiment, the strip 154 forms part of the light barrier between the light source die 130 and the light detector die 120. The strip 154 can be deposited and cured prior to the light transmissive material 140 being cast or otherwise formed.

Still referring to FIGS. 4A and 4B, it is also possible that the strip 154 not be included, but that the groove 145 is formed in the light transmissive material 140 so that the groove 145 as adjacent and continuous with the groove 152 in the die attachment substrate 110, so that when the groove 152 is filled with the opaque material 140, the groove 152 in the substrate 110 is also filled with the same opaque material 140.

In the embodiments of FIGS. 2A and 2B, and 3A and 3B, if the groove 145 does not extend all the way to the strip 154 of opaque material, or all the way to the die attachment substrate 110, the groove 145 should still be deep enough such that when occupied by the opaque material 150, an adequate light barrier is provided between the light source die 130 and the light detector die 120.

In the embodiments described above, the optical devices 102, 102' and 102" were shown as including a single die attachment substrate to which both the light detector die 120 and the light source die 130 are attached. In alternative embodiments, the optical devices 102, 102' and 102" can include more then one die attachment substrate, e.g., such that the light detector die 120 is attached to one die attachment substrate and the light source die 130 is attached to another (e.g., an adjacent) die attachment substrate. In such embodiments, the groove 145 should still be formed between the light detector die 120 and the light source die 130.

In accordance with an embodiment, the resulting sensor devices 102, 102' and 102" are dual row flat no lead (DFN) devices, as can be seen from FIGS. 2A, 3A and 4A. In FIGS. 2A, 3A and 4A, the exposed leadframe bond pads 114 enable the sensor devices to be connected to other circuitry. Alternatively, other pads, pins, ball grids, or the like, can be provided to enable the optical sensors 102, 102' and 102" to be connected to other circuitry, as is well known in the art.

In each of the above described embodiments, the light transmissive material 140 can have shallow optical structures cast or otherwise formed therein to direct the emission of the light, as well as to direct or restrict the acceptance angle of the detector die. The optical structures may include, but are not limited to, small prisms, diffusers, smooth flat surfaces, lenses, shutters, or holographic elements, as well as combinations of these. For example, the optical structures could be machined into a surface of a mold and replicated in a light transmissive material which is cast or otherwise formed using the mold.

The high level flow diagram of FIG. 5 will now be used to describe methods for providing an optical sensor, in accordance with various embodiments of the present invention. Referring to FIG. 5, at step 502, a light detector die (e.g., 120) is attached to a die attachment substrate (e.g., 110) and a light source die (e.g., 130) is attached to the same die attachment substrate to which the light detector die is attached, or to another die attachment substrate, so that there is a space between the light detector die and the light source die. The dies 120 and 130 can be attached to the die attachment substrate 110, e.g., using an epoxy, which depending upon implementation, can be a non-conducting or a conducting (e.g., a silver filled) epoxy. Other attachment techniques are also possible, and within the scope of the present invention.

At step 504, the light detector die, the light source die and the space between the light detector die and the light source die are covered with a light transmissive material (e.g., 140). This can be accomplished by covering the entire side of the substrate(s), to which the dies are attached, with the light transmissive material. As explained above, the light transmissive material can be can be a clear or other light transmissive epoxy or other resin or polymer. The light transmissive material can be formed, e.g., using cast molding or transfer molding, but is not limited thereto.

At step 506, a groove (e.g., 145) is formed in the light transmissive material between the light detector die and the light source die. As explained above, the groove can be formed by saw cutting, blade cutting or laser cutting, but is not limited thereto. Alternatively, the groove can be formed (e.g., cast) by a feature in a mold used to form the light transmissive material over the dies 120 and 130 and the space therebetween. For example, the groove 145 can be formed by a thin fin machined to project from a mold surface.

Where the groove is formed by cutting into the light transmissive material, the entire space between the light detector die and the light source die can be covered with the light transmissive material at step 504, which will thereafter be cut into at step 506. Where the groove is formed by a feature in a mold, a portion of the space between the light detector die and the light source die will not be covered by the light transmissive material (due to the feature in the mold), with such portion forming the groove.

At step 508, an opaque material (e.g., 150) is put within the groove to form a light barrier between the light detector die and the light source die. As explained above, the opaque material can be, e.g., an opaque epoxy, such as a black epoxy, or some other resin or polymer that is opaque to the wavelength(s) of light of produced by the light emitter die 130. In this manner the formed light barrier prevents light produced by the one or more light emitting elements of the light source die (e.g., 130) from being transmitted directly to and detected by the one or more elements that detect light of the light detector die (e.g., 120).

The opaque material can be placed within the groove in a precise and controlled manner, or can be spread over the entire surface of the light transmissive material to fill the groove and the excess can be wiped or otherwise cleaned away, similar to how tile is grouted. The opaque material can be squirted or otherwise dispensed, e.g., using positive pressure from an applicator (e.g., similar to a hollow needle) to fill or substantially fill the groove in a single pass or a multi-pass process, and excess opaque material can be wiped away or otherwise removed. For example, an automated dispensing system, such as those available from Asymtek of Carlsbad, Calif., can be used to dispense the opaque material. Other techniques can also be used and are within the scope of the present invention.

In specific embodiments, the opaque material fills or at least substantially fills the groove, preferably in a manner that prevents or minimizes the amount air bubbles therein, to maximize the opaqueness of the formed light barrier. In an embodiment the channel can be filled with the opaque material, and then the material can be cured so that air bubble collapse. Thereafter, one or more further layer/coating of the opaque material can be applied to fill in a dent or well that results after the air bubbles collapse.

After step 502, but before steps 504, 506 and 508, wire bonding or the like can be performed to connect the dies (e.g., 120 and 130) to bond pads (e.g., 114). Prior to steps 504, 506 and 508 (and either before or after step 502), a strip of opaque material (e.g., 154) can be formed on the die attachment substrate, as was described above with reference to FIGS. 3A, 3B, 4A and 4B, to allow for some slop (i.e., to increase the tolerance) of the depth control when saw, blade or laser cutting the groove in light transmissive material (e.g., 140), while still allowing for a complete optical barrier so long as the groove is cut such that it extends to or into the strip of opaque material. Such a strip of opaque material (e.g., 154) can be formed, e.g., using an automated dispensing system, such as those available from Asymtek of Carlsbad, Calif. Also, as was discussed above with reference to FIGS. 4A and 4B, a groove (e.g., 152) can be formed in the die attachment substrate 110 (e.g., etched into the substrate 110), and the groove may or may not be covered with a strip of opaque material (e.g., 154). The groove (e.g., 152) can also be used to increase the tolerance in the groove cut depth.

Figure 6:
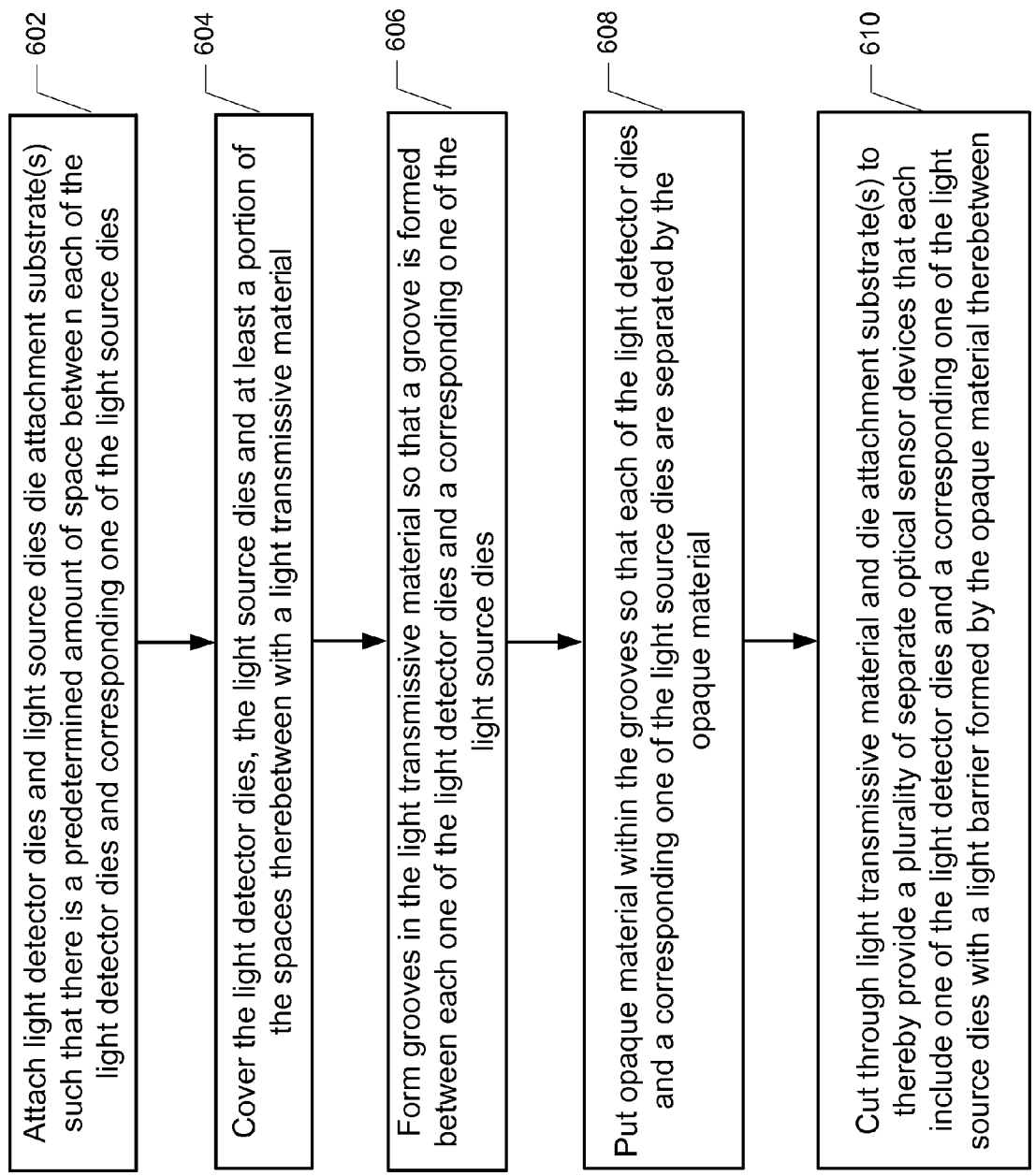
FIG. 6 is a high level flow diagram that is used to summarize various methods for providing a plurality of optical sensor devices, in accordance with embodiments of the present invention.

An advantage of certain embodiments of the present invention is that a plurality of optical sensors can be produced in a cost and time effective manner, as will now be summarized with reference to the high level flow diagram of FIG. 6. Referring to FIG. 6, at step 602, a plurality of light detector dies and a plurality of light source dies are attached to one or more die attachment substrates such that there is a predetermined amount of space between each one of the light detector dies and a corresponding one of the light source dies. For example, 1000 light detector dies and 1000 corresponding light source dies can be attached to a 2×6 inch leadframe die attachment substrate in rows and columns (e.g., 20 rows×50 columns) such that there is a predetermined amount of space (e.g., 1 mm) between each one of the light detector dies and a corresponding one of the light source dies.

At step 604, the light detector dies, the light source dies and at least a portion of the spaces therebetween are covered with a light transmissive material, using one of the techniques described above with reference to step 504. For example, all of the dies and the spaces therebetween can be covered using the same molding process at the same time. This can be accomplished by covering the entire side of the substrate(s), to which the dies are attached, with the light transmissive material.

At step 606, grooves in the light transmissive material are formed so that a groove is formed between each one of the light detector dies and the corresponding one of the light source dies. As was explained above, saw, blade or laser cutting, or the like, can be used to form such grooves. Where the light detector dies and the light source dies are attached in rows and columns, relatively few cuts would need to be made to form the grooves between all of the light sources and the corresponding light detectors. For example, where there are 20 rows×50 columns of die pairs (where a die pair is one of the light detector dies and a corresponding one of the light source dies), as few as 20 cuts would need to be made to form the grooves for all 1000 die pairs. The precise number of cuts would depend on the arrangement of the die pairs on the die attachment substrate(s). As was explained above, features of a mold (used to form the light transmissive material over the dies) can alternatively be used to form the grooves. Where the light detector dies and the light source dies are attached in rows and columns, relatively few mold features would be needed to form the grooves between all of the light sources and the corresponding light detectors. For example, where there are 20 rows×50 columns of die pairs, as few as 20 thin fins machined to project from a mold surface can be used to form the grooves for all 1000 die pairs. The precise number of mold features would depend on the arrangement of the die pairs on die attachment substrate(s).

Where the grooves are formed by cutting into the light transmissive material, the entire space between each die pair can be covered with the light transmissive material at step 604, which will thereafter be cut into at step 606. Where the grooves are formed by features of a mold, a portion of the space between each die pair will not be covered by the light transmissive material (due to a feature in the mold), with such portion forming the groove.

At step 608, an opaque material (e.g., 150) is put within the grooves to form a light barrier between each one of the light detector dies and the corresponding one of the light source dies. Exemplary techniques for putting the opaque material within the grooves is provided above in the discussion of step 508. If a precision dispensing machine were used to dispense the opaque material into the grooves, relatively few passes of the dispensing machine would be needed to fill the grooves between all of the light sources and the corresponding light detectors. For example, where there are 20 rows×50 columns of die pairs, as few as 20 passes of the dispensing machine can be used to fill the grooves for all 1000 die pairs. The precise number of passes would depend on the arrangement of the die pairs on die attachment substrate(s).

After step 602, but before steps 604, 606 and 608, wire bonding or the like can be performed to connect the dies to bond pads (e.g., 114). Prior to steps 604, 606 and 608 (and either before or after step 602), strips of opaque material (e.g., 154) can be formed on the die attachment substrate(s), as was described above with reference to FIGS. 3A, 3B, 4A and 4B, to allow for some slop (i.e., to increase the tolerance) of the depth control when saw, blade or laser cutting the groove in light transmissive material (e.g., 140), while still allowing for a complete optical barrier so long as the grooves are cut such that it extends to or into the strip of opaque material. Where the light detector dies and the light source dies are attached in rows and columns, relatively few strips would need to be formed. For example, where there are 20 rows×50 columns of die pairs, as few as 20 strips of opaque material would need to be formed for all 1000 die pairs. The precise number of strips would depend on the arrangement of the die pairs on the die attachment substrate(s). Also, as was discussed above with reference to FIGS. 4A and 4B, grooves (e.g., 152) can be formed in the die attachment substrate(s) 110 (e.g., etched into the substrate 110), and the grooves may or may not be covered with strips of opaque material (e.g., 154), to increase the tolerance in the groove cut depth. Where the light detector dies and the light source dies are attached in rows and columns, relatively few grooves in the die attachment substrate(s) would need to be formed. For example, where there are 20 rows×50 columns of die pairs, as few as 20 grooves in the die attachment substrate(s) would need to be formed for all 1000 die pairs.

The optical sensors described above can provide proximity sensing capabilities, as well as other capabilities, such as, but not limited to, ambient light detection. For example, the light detector die 120 can include circuitry to detect ambient light when the optical sensor is not being used to detect proximity. The light detector die 120 may also include circuitry to discriminate between light emitted from the light source die 130 that was reflected back toward the light detector die and ambient light, e.g., produced by the sun or an artificial light source intended to light a room.

Figure 7:
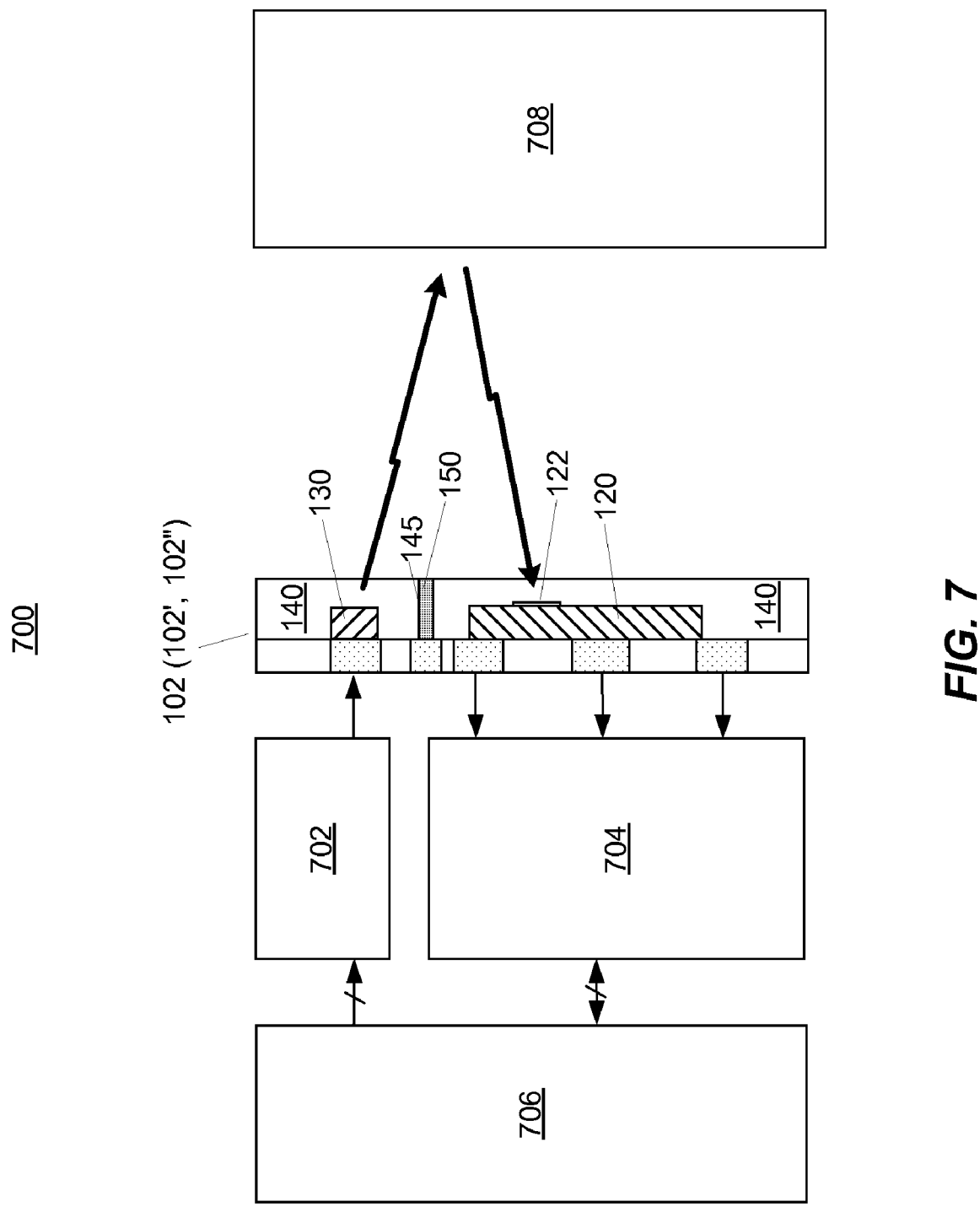
FIG. 7 is a high level block diagram of a system that includes an optical sensor of an embodiment of the present invention.

The optical sensors 102, 102' and 102" described above can be used in various systems, including, but not limited to, mobile phones, portable computers, portable video players, handheld devices, and the like. Referring to a system 700 shown in FIG. 7, for example, an optical sensor 102, 102' or 102" can be used as a proximity sensor to control whether a subsystem 706 (e.g., a touch-screen, backlight, virtual scroll wheel, virtual keypad, navigation pad, etc.) is enabled or disabled. For example, the optical sensor 102, 102' or 102" can detect when an object 708, such as a person's finger, is approaching, and based on the detection either enable (or disable) a subsystem 706.

When used as a proximity sensor, light emitted from the light emitting element(s) of the light source die 130 (or at least a portion of such light) will be reflected by an object (e.g., 708) when there is any, and be received by the light detector element(s) of light detector die 120. The light detector die 120 can convert the reflected light (and potentially also ambient light) to a current, and a resistor and/or other component(s), e.g., a transimpedance amplifier, can be used to convert such a current to a voltage. The intensity of the reflected light received by the light source die 120 is generally decreased at a rate of about $1/(4*X^2)$, where X is the distance between the object 708 and the sensor 102, 102' or 102". However, as just mentioned, the total light received can also includes ambient light, which may be from sun light, halogen light, incandescent light, fluorescent light, etc. Various techniques can be used to filter or separate out the ambient light response, some examples of which are disclosed in U.S. patent application Ser. No. 12/101,047, entitled PROXIMITY SENSORS AND METHODS FOR SENSING PROXIMITY, filed Apr. 10, 2008, which is incorporated herein by reference.

The system 700 can include one or more drivers 702 (e.g., an LED driver or laser driver) that drives the light emitting elements of the light source die 130. One or more output of the optical sensor 102, 102' or 102", which is indicative of detected light, can be provided to a processor and/or circuitry 704, e.g., which can include one or more comparators. The processor and/or circuitry 704 can, for example, compare the output(s) of the sensor 102, 102' or 102" to one or more thresholds to determine whether the object is within a range where the subsystem 706 should be enabled (or disabled, depending on what is desired), or to determine whether a touch key (e.g., of a touch keyboard) has been pressed. Multiple thresholds can be used, and more than one possible response can occur based on the detected proximity of an object. For example, a first response can occur if an object is within a first proximity range, and a second response can occur if the object is within a second proximity range. Other responses to the proximity of an object are also possible. The system 700 can additionally, or alternatively, use the optical sensor (e.g., 102, 102' or 102") to detect transient motion of an object, which is useful to distinguish a stationary object (e.g., a chair) within the range of the sensor from a non-stationary object. Time multiplexing and/or filtering may also be used so that the optical sensor 102, 102' or 102" can also be used as an ambient light sensor. When used as an ambient light sensor, the optical sensor 102, 102' or 102" can be used, e.g., to control the brightness of a display, to control the lighting within a room or other space, etc. These are just a few exemplary uses of the optical sensors 102, 102' and 102", which are not meant to be all inclusive.

Figure 8:
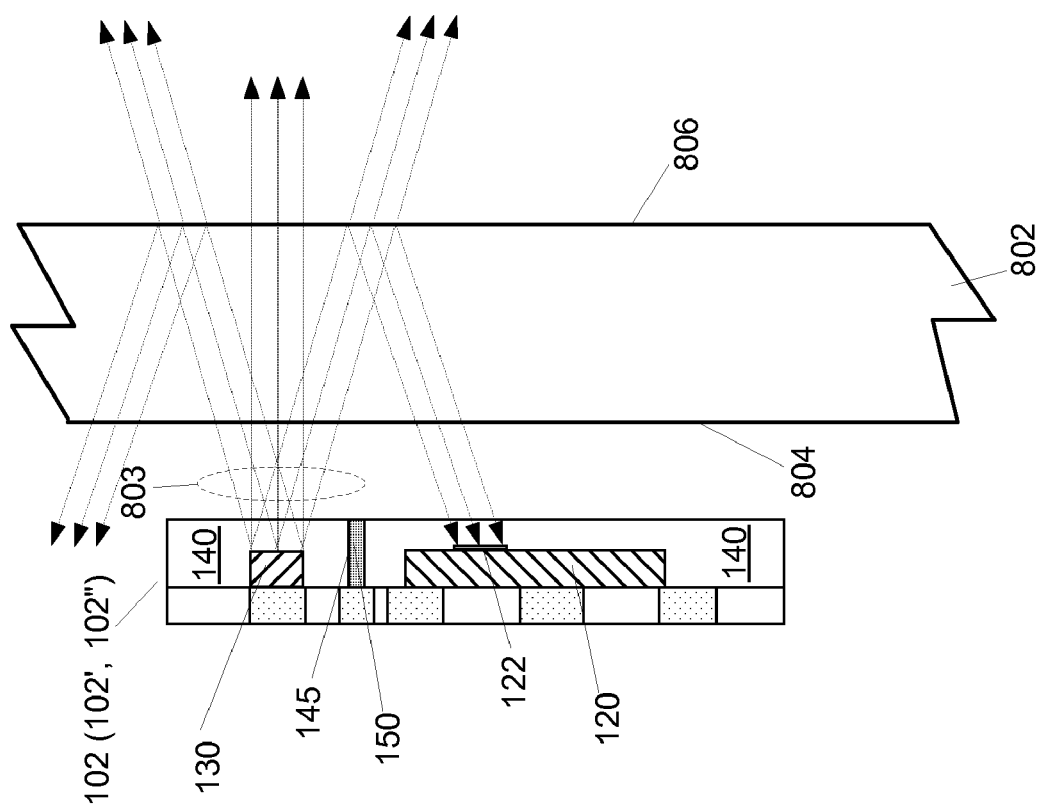
FIG. 8 illustrates how an optical sensor can be placed behind a cover plate that can cause specular reflections.

Referring now to FIG. 8, optical sensors (e.g., 102, 102' and 102") may be used with (e.g., placed behind or covered by) a cover plate 802, which can be made, e.g., of glass, plastic, or some other protective light transmissive material. Such a cover plate 802 includes a close surface 804 and a far surface 806, with a thickness of the plate 802 therebetween. While the close surface 804 is shown as being a distance from the top surface of the optical sensor (e.g., 102, 102' or 102"), it is also possible that the close surface is in contact with (i.e., abuts against) the top surface of the optical sensor. The cover plate 802 can be, e.g., the glass covering a screen of a mobile phone, personal music player or personal data assistant (PDA), or the plastic covering the screen of a laptop computer, but is not limited thereto.

Exemplary light rays 803 are also shown in FIG. 8. As can be appreciated from FIG. 8, at least some of the light rays, or portions thereof, can be reflected back toward the active area 122 of the light detector die 120 due to specular reflections. Just as it is desirable to minimize light being transmitted directly from the source to the detector, it is also desirable to minimize the specular reflections because such reflections similarly reduce the capability of the overall device to sense distance since they are essentially noise that contain no information. To reduce and preferably prevent the detection of specular reflections by the light detector die 120 (and more specifically, by the active area 122 of the light detector die 120), alternative light barriers can be used, in accordance with certain embodiments of the present invention, as will be described below.

Figure 9A:
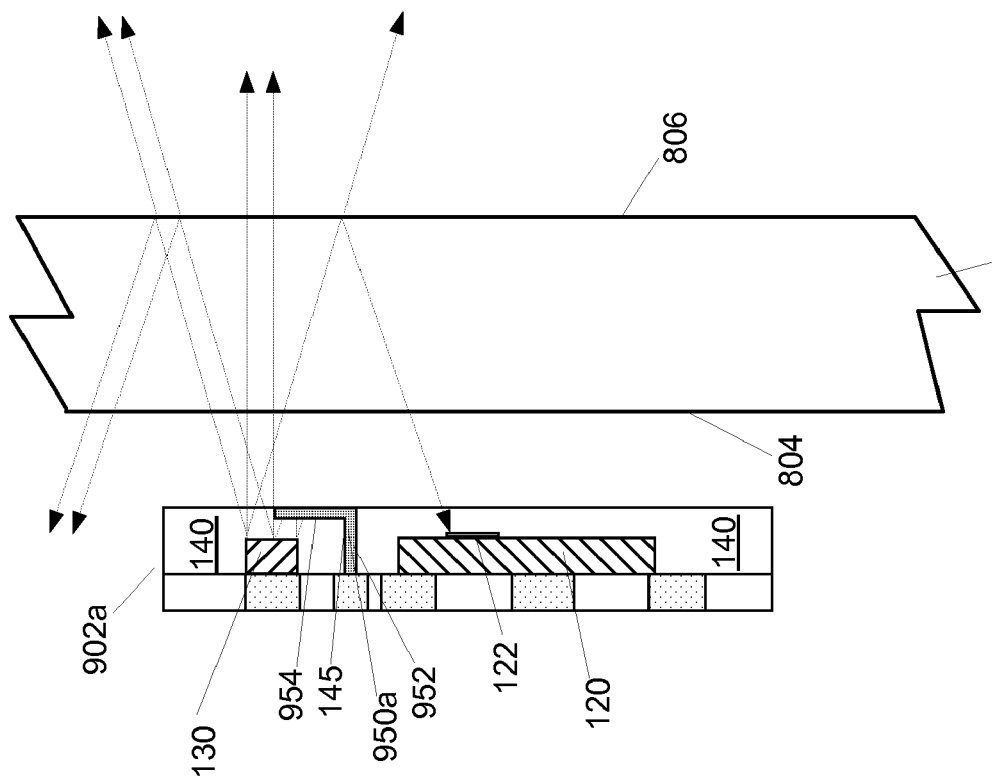
FIG. 9A is a cross-sectional view of an optical sensor device including an L-shaped barrier, according to an embodiment of the present invention.

Referring to FIG. 9A, in accordance with an embodiment of the present invention, a light barrier 950*a* includes a first portion 952 (similar to barrier 150) that prevents light produced by the light source die 130 from travelling directly to the light detector die 120, in the same manner as did light barrier 150. Additionally, the light barrier 950*a* includes a second portion 954 that reduces specular reflections. This second portion 954, which extends from the first portion, forms a shelf over the light source die 120, and in an embodiment, covers at least a portion of a light emitting element(s) of the light source die 120, as shown in FIG. 9. As also shown in FIG. 9A, the light barrier 950*a* can be considered "L-shaped" because the first and second portions 952 and 954 collectively resemble the letter "L". In specific embodiments, the second portion 954 of the light barrier 950*a* is perpendicular to the first portion 952.

As can be appreciated from a comparison between FIG. 8 and FIG. 9A, the second portion 954 of the light barrier 950*a* reduces the amount of specular reflections, and thereby reduces (and preferably minimizes) the amount of light detected by the active area 122 of light detector die 120 that would otherwise be due to specular reflections, if the sensor is used with a cover plate (e.g., 802). In this manner, the second portion 954 of the light barrier 950*a* increases the sensitivity of the sensor 902*a*. Stated another way, the second portion 954 of the light barrier 950*a* increases the percentage of light that will be detected by the active area 122 of light detector die 120 that is actually due to reflections by an object on the far side of the cover plate 802 (as opposed to reflections from the cover plate 802 itself).

Figure 9B:
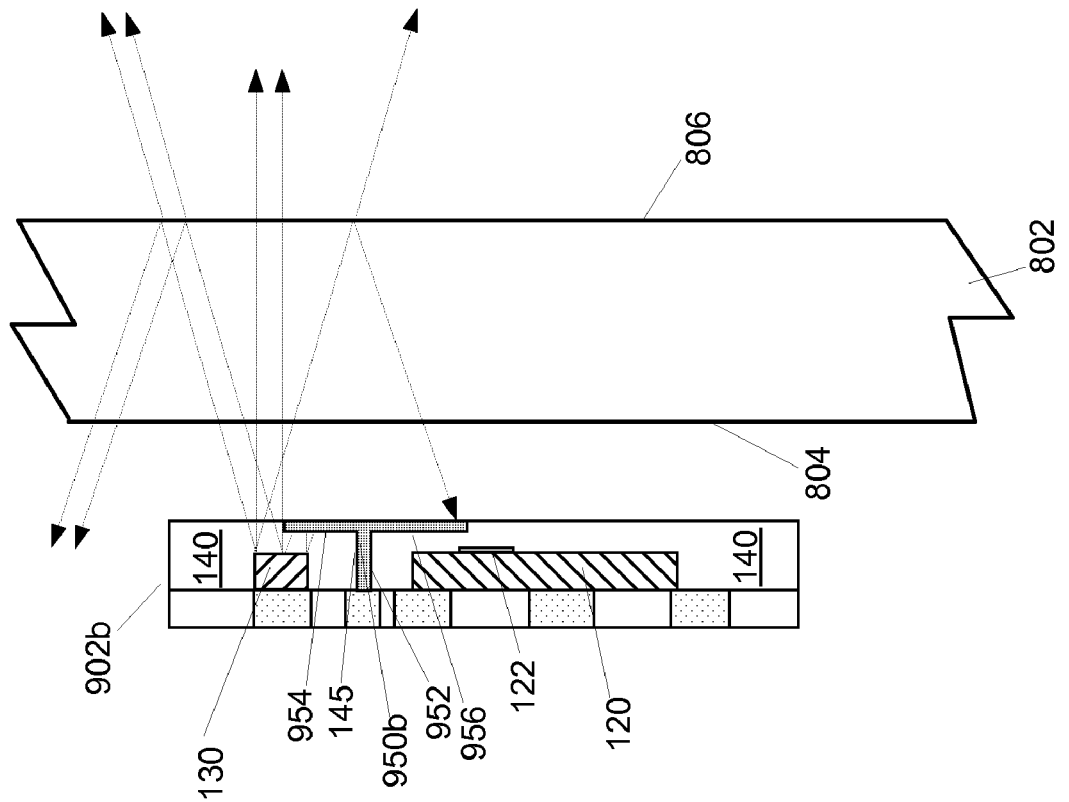
FIG. 9B is a cross-sectional view of an optical sensor device including an L-shaped barrier, according to another embodiment of the present invention.

Referring to FIG. 9B, in accordance with an embodiment of the present invention, a light barrier 950*b* includes the first portion 952 (similar to barrier 150), the second portion 954 (that reduces specular reflections in the same manner described with reference to FIG. 9A), and a third portion 956 that reduces the detection of specular reflections. This third portion 956 forms a shelf over the light detector die 130, and in an embodiment, covers at least a portion of the active area 122, as shown in FIG. 9B. As also shown in FIG. 9B, such a light barrier 950*b* can be considered "T-shaped" because the first, second and third portions 952, 954 and 956 collectively resemble the letter "T". In specific embodiments, the second portion 952 and the third portion 954 of the light barrier 950*b* are each perpendicular to the first portion 952. In another embodiment, a barrier includes the portion 952 and 956, but not the portion 952, in which case, the barrier could be L-shaped.

As can be appreciated from a comparison between FIG. 8 and FIG. 9B, the third portion 956 of the light barrier 950*b* reduces the amount of specular reflections that are detected by the active area 122 of the light detector die 120, and thereby, increases the sensitivity of the sensor. Stated another way, the third portion 956 of the light barrier 950b blocks at least some specular reflections that would otherwise be detected by the active area 122 of the light detector die 120 if the third portion 956 were not included.

The L-shaped light barrier 950a, or the T-shaped light barrier 950b, can be used in place of the barrier 150 shown in any of the previously discussed FIGS., and thus can be used with or without the groove 152 (formed in the die attachment substrate 110) and/or the strip of opaque material 154 (formed below the barrier). The L-shaped light barrier 950a, or the T-shaped light barrier 950b, can be at least partially formed during steps 506 and 508 (or steps 606 and 608). For example, at step 506 (or step 606), before, after or while the groove (e.g., 145) is formed in the light transmissive material between the light detector die and the light source die (e.g., by saw cutting, blade cutting or laser cutting) an adjacent shallow groove can also be formed on one side (or both sides) of the groove 145, where the adjacent groove(s) have the desired dimensions of the second and/or third portions 954 and/or 956. Alternatively, where a mold is used, the groove 145 corresponding to the first portion 952, and an adjacent groove corresponding to the second portion 954 (and optionally also another adjacent groove corresponding to the third portion 956) of the barrier 950a (or 950b) can be formed by corresponding features of the mold. The forming of the barrier 950a (or 950b) can be completed at steps 508 or 608 when the opaque material is put within the formed groove(s).

In FIGS. 9A and 9B, the outermost surface of the second portion 954 (and optionally also the third portion 956) of the light barrier 950a (or 950b) is shown as being substantially flush with the outermost (i.e., top) surface of the light transmissive material 140. Referring now to the sensors 902c and 902d of FIGS. 9C and 9D, in alternative embodiments, the first portion 952 of the barrier 950c (or 950d) can be formed in the same manner that the barrier 150 was formed, as described above, and the second portion 954 (and optionally also the third portion 956) can be formed above the outermost (i.e., top) surface of the light transmissive material 140. The same opaque material used to form the first portion 952 of the barrier can be used to form the second portion 954 (and optionally also the third portion 956), or a different opaque material can be used. The second portion 954 (and optionally also the third portion 956) of the barrier 950c (or 950d) can be formed above the outermost (i.e., top) surface of the light transmissive material 140 in a single or multi-pass process, e.g., using an automated dispensing system, such as those available from Asymtek of Carlsbad, Calif., and/or using a mask (similar to a lithography mask) or screen (similar to a silk screen), but is not limited thereto. In other words, the second portion 954 (and optionally also the third portion 956) of the barrier 950c (or 950d) can essentially be painted or otherwise deposited in the desired pattern onto the outermost (i.e., top) surface of the light transmissive material 140, with portions of the pattern overlapping the outermost (i.e., top) surface of the first portion 952 of the barrier 950c (or 950d). In such embodiments, the second portion 954 (and optionally also the third portion 956) still extend from the first portion 952.

Figure 9C:
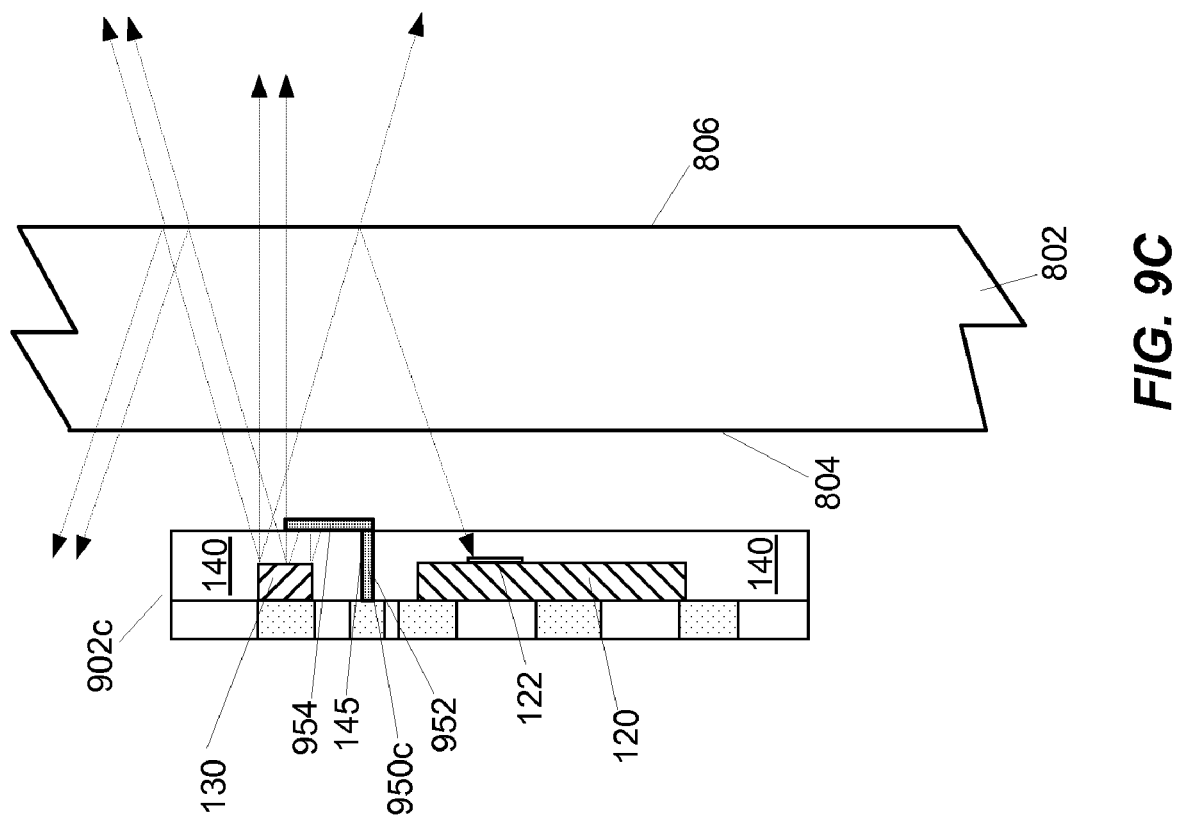
FIG. 9C is a cross-sectional view of an optical sensor device including a T-shaped barrier, according to an embodiment of the present invention.
Figure 9D:
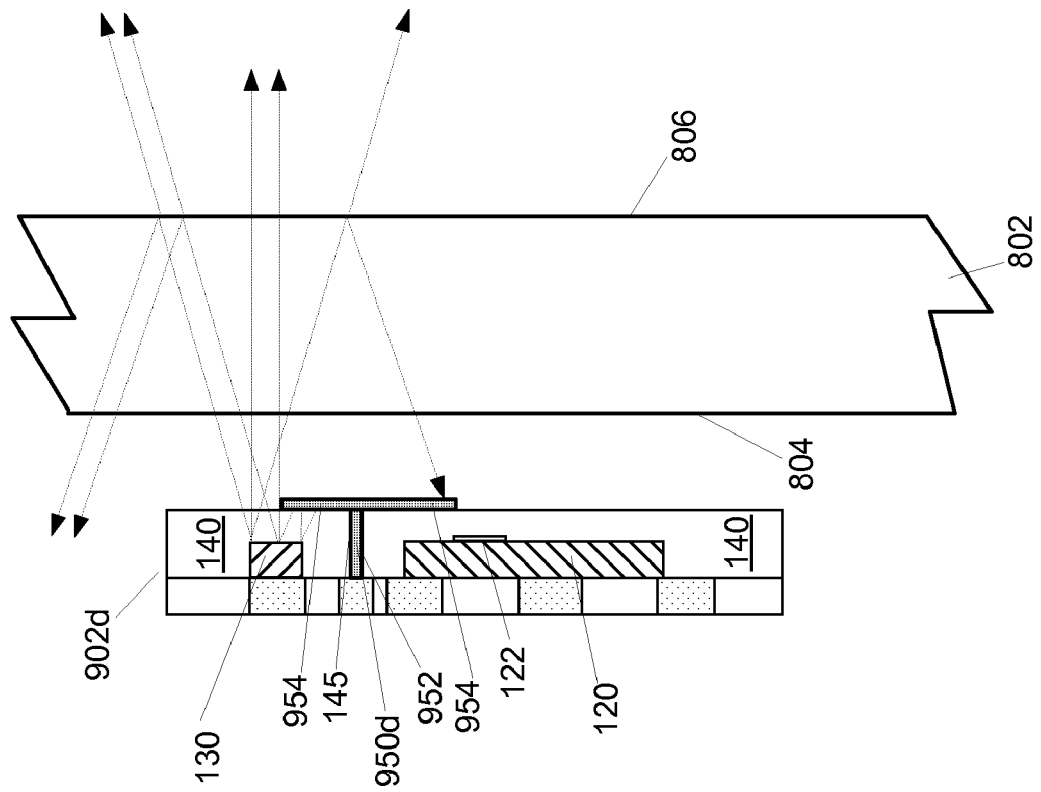
FIG. 9D is a cross-sectional view of an optical sensor device including a T-shaped barrier, according to another embodiment of the present invention.

For the embodiments of FIGS. 9C and 9D, the second portion 954 (and optionally also the third portion 956) can be formed above the outermost (i.e., top) surface of the light transmissive material 140 after step 508 (of FIG. 5), or between steps 608 and 610 (of FIG. 6).

Figure 10:
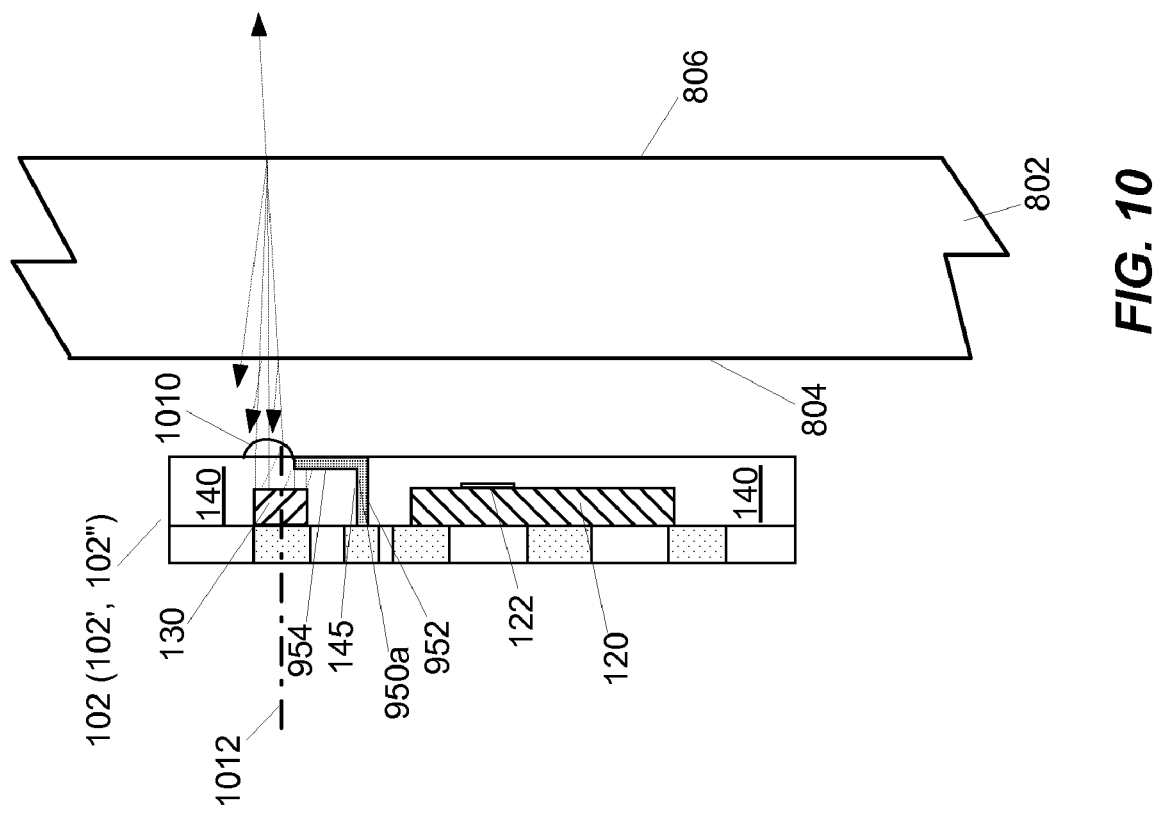
FIG. 10 is a cross-sectional view of an optical sensor device including an off-centered lens, according to an embodiment of the present invention.

In further embodiments, a lens 1010 is placed at least partially over the light emitting element(s) of the light source die 130, off-centered relative to the center of the light emitting element(s). More specifically, the center of the lens 1010 is offset in a direction away from the first portion 952 of the barrier 950, as shown in FIG. 10, where line 1012 represents the center of the light emitting element(s). By redirecting the light output by the light source die 130 (or at least a portion of such light) in a direction away the light detector die 120, the off-centered lens 1010 reduces the amount of specular reflections (and thereby reduces the amount of light detected by the active area 122 of light detector die 120 that would otherwise be due to specular reflections), and thereby, increases the sensitivity of the sensor. As shown in FIG. 10, the off-centered lens 1010 can be used with the L-shaped barrier 950a of FIG. 9A, or can alternatively be used with the L-shaped barrier 950c of FIG. 9C. In other embodiments, the off-centered lens 1010 can be used together with the T-shaped barriers 950b and 950d of FIGS. 9B and 9D. In still other embodiments, the off-centered lens 1010 can be used with the barrier 150 shown in FIGS. 3A, 3B, 4A, 4B, 7 and 8.

In FIG. 10, the lens 1010 is shown as being convex. However, alternative positive or converging lens may be used. The lens 1010, or an alternative lens, can be formed as part of, or after, step 504 (or 604) when the light detector die, the light source die and the space therebetween are covered with a light transmissive material (e.g., 140). For example, where the light transmissive material is formed using cast molding or transfer molding, the lens can be formed by a feature of the mold. In other embodiments, the lens is machined into the top surface of the light transmissive material 140. In still other embodiments, the lens is formed separately, and attached to the top surface of the light transmissive material 140, e.g., using a clear or other light transmissive epoxy.

Explained above with reference to FIGS. 8-10 are how an L-shaped barrier (e.g., 950a or 950c), a T-shaped barriers (e.g., 950b or 950d), and an off-centered lens (e.g., 1010) can be used to improve the performance of the optical sensors 102, 102' and 102" initially described with reference to FIGS. 1-7 (e.g., improve sensitivity be reducing the potential effects of specular reflections). Specific techniques for forming the various opaque light barriers have also be described above. Further embodiments of the present invention are directed to the use of an L-shaped barrier (similar to 950a or 950c), a T-shaped barrier (similar to 950b or 950d), and/or the use of an off-centered lens (e.g., similar to 1010), with any optical sensor including a light source and a light detector, regardless of how the barrier and the remainder of the sensor is manufactured. For example, an L-shaped barrier (similar to 950a or 950c) or a T-shaped barrier (similar to 950b or 950d) can be formed using injection molding, or some other molding process, before or after a light source and a light detector are placed on opposing sides of a first portion (similar to 952) of the barrier. For another example, at least a portion of a light source can be covered with a lens that is off-centered (relative to a center of the one or more light emitting elements of the light source), such that the center of the lens is offset in a direction away from the first portion (similar to 952) of the opaque light barrier, regardless of how the barrier and the remainder of the sensor is manufactured. In other words, the techniques for reducing specular reflections, and reducing the amount of specular reflections that would be detected by a light detector if a light transmissive cover is placed over an optical sensor, can be applied to alternative optical sensors, while still being with the scope of specific embodiments of the present invention. Systems including sensors 902a, 902b, 902c or 902d, or the alternative sensors just described above, can resemble the system 700 describe with reference to FIG. 7, but are not limited thereto.

Figure 11:
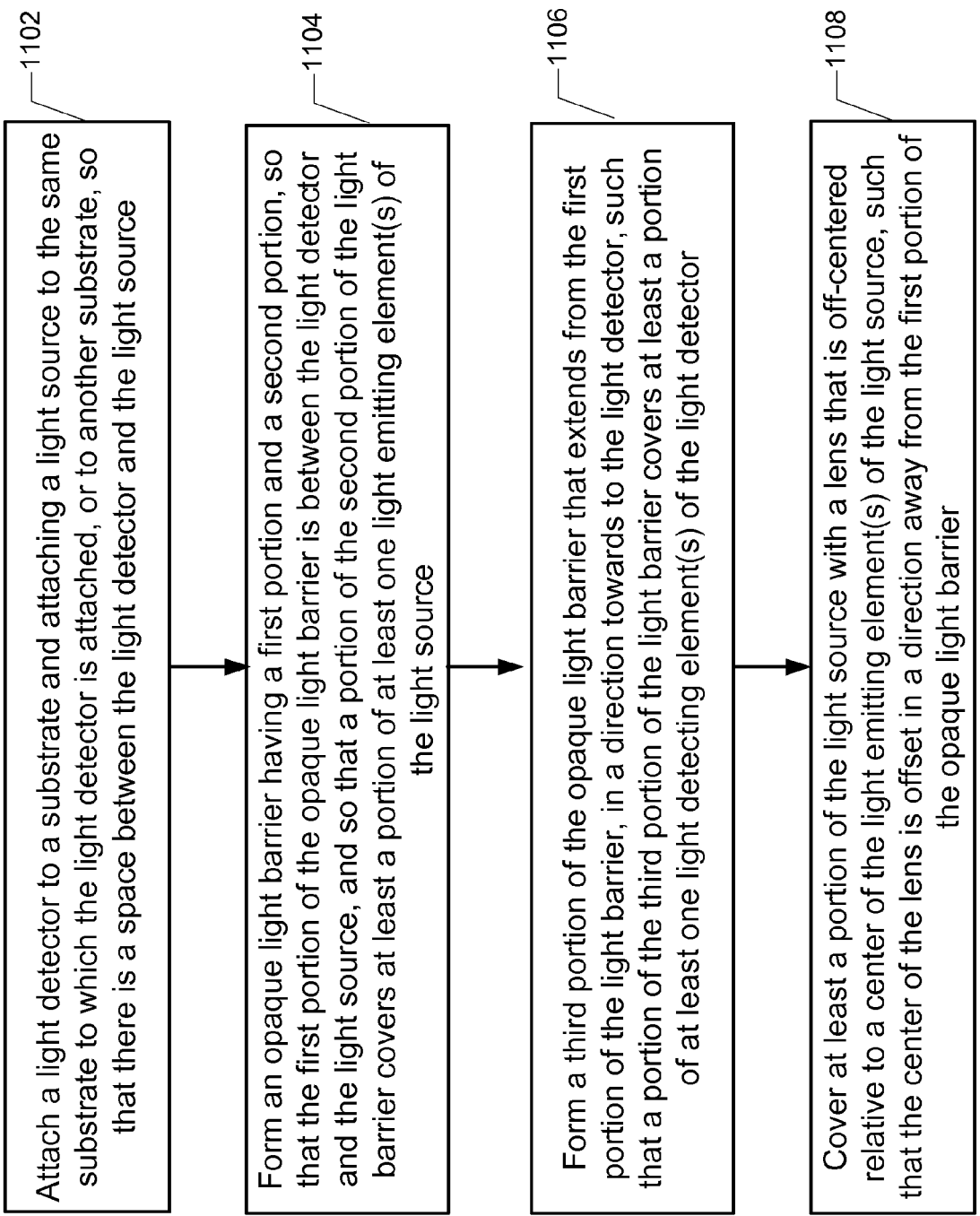
FIGS. 11 and 12 are high level flow diagrams that are used to summarize specific embodiments of the present invention that can be used to provide optical sensor devices.
Figure 12:
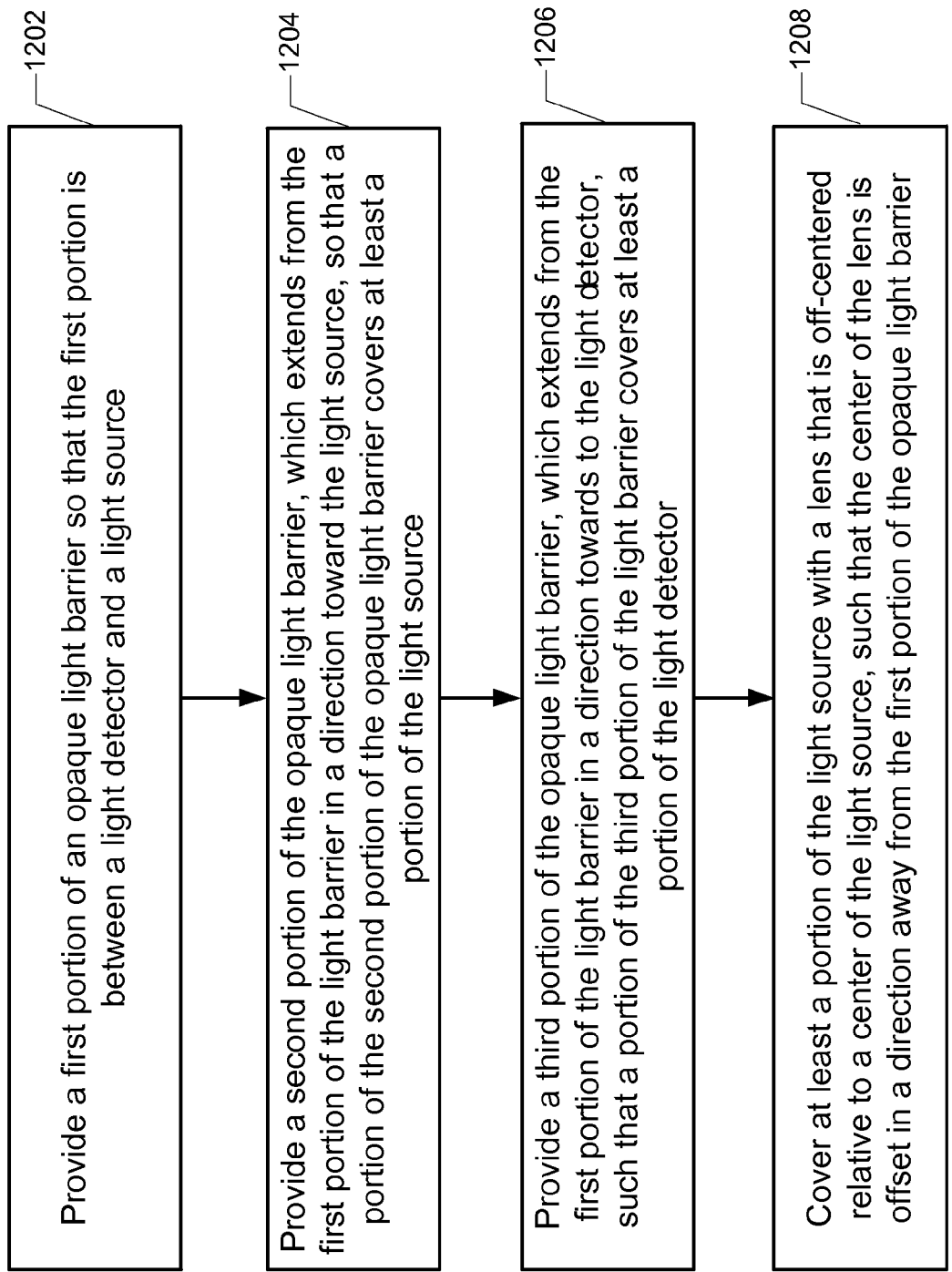

FIGS. 11 and 12 are used to summarize specific embodiments of the present invention that can be used to provide an optical sensor device. In these FIGS., depending upon the embodiment, the steps can be performed in a different order and/or certain steps can be performed while other(s) are not. For example, referring to FIG. 11, step 1106 can be performed after step 1108, or not at all. For another example, it is possible to form the so called first and third portions of the light barrier, without forming the second portion. For another s example, in FIG. 12, steps 1202, 1204 and 1206 can be performed at the same time. For a further example, in FIG. 12, only one or two of steps 1204, 1206 and 1208 can be performed. These are just a few examples, which are not meant to be all inclusive.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. An optical sensor device, comprising:
a light source including one or more light emitting elements;
a light detector including one or more light detecting elements;
a light transmissive material molded over and encapsulating the light source and the light detector;
an opaque light barrier including a first portion and a second portion that extends from the first portion;
wherein the first portion of the light barrier is between the light source and the light detector; and
wherein the second portion of the light barrier extends from the first portion of the light barrier a distance greater than an entire gap between the first portion of the light barrier and at least one of the one or more light emitting elements of the light source, in a direction towards the light source, such that a portion of the second portion of the light barrier extends over at least a portion of at least one of the one or more light emitting elements of the light source;
wherein the first portion of the light barrier separates a portion of the light transmissive material molded over and encapsulating the light source from a portion of the light transmissive material molded over and encapsulating the light detector;
wherein the second portion of the light barrier portion covers and is located on a portion of an outermost surface of the portion of the light transmissive material molded over and encapsulating the light source; and
wherein the second portion of the light barrier is configured to reduce an amount of specular reflections, if a light transmissive cover plate were placed over the optical sensor device.

2. The optical sensor device of claim 1, wherein the opaque light barrier is L-shaped.

3. The optical sensor of claim 1, wherein the first portion of the light barrier is configured to block light from being transmitted directly from the light source to the light detector.

4. The optical sensor device of claim 1, wherein the second portion of the light barrier is painted or otherwise deposited in a pattern onto the outermost surface of the portion of the light transmissive material molded over and encapsulating the light source, with portions of the pattern overlapping the outermost surface of the first portion of the light barrier.

5. The optical sensor device of claim 1,
wherein the opaque light barrier includes a third portion that extends from the first portion of the light barrier a distance greater than an entire gap between the first portion of the light barrier and the light detector, in a direction towards the light detector, such that a portion of the third portion of the light barrier extends over at least a portion of at least one of the one or more light detecting elements of the light detector;
wherein the third portion of the light barrier portion covers and is located on a portion of an outermost surface of the portion of the light transmissive material molded over and encapsulating the light detector; and
wherein the third portion of the light barrier is configured to reduce an amount of specular reflections that would be detected by the one or more light detecting elements of the light detector, if a light transmissive cover plate were placed over the optical sensor device.

6. The optical sensor device of claim 5, wherein the opaque light barrier is T-shaped.

7. The optical sensor of claim 5, wherein:
the first portion of the light barrier is configured to block light from being transmitted directly from the light source to the light detector.

8. The optical sensor device of claim 5, further comprising:
a lens covering at least a portion of the light source;
wherein the lens is off-centered relative to a center of the one or more light emitting elements of the light source, such that a center of the lens is offset in a direction away from the first portion of the opaque light barrier;
wherein the lens is laterally located relative to the second portion of the light barrier; and
wherein the lens is located on a portion of an outermost surface of the portion of the light transmissive material molded over and encapsulating the light source, or is part of the light transmissive material molded over and encapsulating the light source.

9. The optical sensor of claim 8, wherein the lens is configured to reduce an amount of specular reflections that would be detected by the light detector, if a light transmissive cover plate were placed over the optical sensor device.

10. The optical sensor of claim 8, wherein the lens comprises a convex lens.

11. An optical sensor device, comprising:
a light source including one or more light emitting elements;
a light detector including one or more light detecting elements;
a light transmissive material molded over and encapsulating the light source and the light detector;
an opaque light barrier including a first portion and a second portion; and
a lens covering at least a portion of the light source;
wherein the first portion of the light barrier is between the light source and the light detector and separates a portion of the light transmissive material molded over and encapsulating the light source from a portion of the light transmissive material molded over and encapsulating the light detector;
wherein the second portion of the light barrier extends from the first portion of the light barrier, in a direction towards the light source, such that a portion of the second portion of the light barrier covers at least a portion of at least one of the one or more light emitting elements of the light source;

wherein the second portion of the light barrier covers and is located on a portion of an outermost surface of the portion of the light transmissive material molded over and encapsulating the light source;

wherein the second portion of the light barrier reduces an amount of specular reflections if a light transmissive cover plate were placed over the optical sensor device;

wherein the lens is off-centered relative to a center of the one or more light emitting elements of the light source, such that a center of the lens is offset in a direction away from the first portion of the opaque light barrier;

wherein the lens is laterally located relative to the second portion of the light barrier; and wherein the lens is located on a portion of an outermost surface of the portion of the light transmissive material molded over and encapsulating the light source, or is part of the light transmissive material molded over and encapsulating the light source.

12. The optical sensor of claim 11, wherein the lens is configured to reduce an amount of specular reflections that would be detected by the light detector, if a light transmissive cover plate were placed over the optical sensor device.

13. The optical sensor of claim 11, wherein the lens comprises a convex lens.

14. A method for providing an optical sensor device, comprising:
(a) attaching a light detector to a substrate and attaching a light source to the same substrate to which the light detector is attached, or to another substrate, so that there is a space between the light detector and the light source, wherein the light detector includes one or more light detecting elements, and the light source includes one or more light emitting elements;
(b) molding a light transmissive material over the light source and the light detector to thereby encapsulate the light source and the light detector with the light transmissive material;
(c) forming an opaque light barrier having a first portion and a second portion, so that the first portion of the opaque light barrier separates a portion of the light transmissive material molded over and encapsulating the light detector from a portion of the light transmissive material molded over and encapsulating the light source, so that the second portion of the light barrier is located on a portion of an outermost surface of the portion of the light transmissive material molded over and encapsulating the light source and extends from the first portion of the light barrier a distance greater than an entire gap between the first portion of the light barrier and at least one of the one or more light emitting elements of the light source, so that a portion of the second portion of the light barrier extends over at least a portion of at least one of the one or more light emitting elements of the light source.

15. The method of claim 14, wherein step (b) also includes forming a third portion of the opaque light barrier that extends from the first portion of the light barrier a distance greater than an entire gap between the first portion of the light barrier and the light detector, in a direction towards the light detector, so that the third portion of the light barrier is located on a portion of an outermost surface of the portion of the light transmissive material molded over and encapsulating the light detector, and so that a portion of the third portion of the light barrier extends over at least a portion of at least one of the one or more light detecting elements of the light detector.

16. The method of claim 15, further comprising:
(d) covering at least a portion of the light source with a lens that is off-centered relative to a center of the one or more light emitting elements of the light source and laterally located relative to the second portion of the light barrier, such that the center of the lens is offset in a direction away from the first portion of the opaque light barrier, and such that the lens is located on a portion of an outermost surface of the portion of the light transmissive material molded over and encapsulating the light source, or is part of the light transmissive material molded over and encapsulating the light source.

17. The method of claim 14, wherein step (c) includes forming the second portion of the opaque light barrier by painting or otherwise depositing an opaque material in a pattern onto the outermost surface of the portion of the light transmissive material molded over and encapsulating the light source, with portions of the pattern overlapping the outermost surface of the first portion of the light barrier.

18. A method for providing an optical sensor device, comprising:
(a) attaching a light detector to a substrate and attaching a light source to the same substrate to which the light detector is attached, or to another substrate, so that there is a space between the light detector and the light source, wherein the light detector includes one or more light detecting elements, and the light source includes one or more light emitting elements;
(b) molding a light transmissive material over the light source and the light detector to thereby encapsulate the light source and the light detector with the light transmissive material;
(c) forming an opaque light barrier having a first portion and a second portion, so that the first portion of the opaque light barrier separates a portion of the light transmissive material molded over and encapsulating the light detector from a portion of the light transmissive material molded over and encapsulating the light source, so that the second portion of the light barrier is located on a portion of an outermost surface of the portion of the light transmissive material molded over and encapsulating the light source, and so that a portion of the second portion of the light barrier covers at least a portion of at least one of the one or more light emitting elements of the light source; and
(d) covering at least a portion of the light source with a lens that is off-centered relative to a center of the one or more light emitting elements of the light source and laterally located relative to the second portion of the light barrier, such that the center of the lens is offset in a direction away from the first portion of the opaque light barrier, and such that the lens is located on a portion of an outermost surface of the portion of the light transmissive material molded over and encapsulating the light source, or is part of the light transmissive material molded over and encapsulating the light source.

19. A method for use with a light sensor device include a light detector and a light source spaced apart from one another, wherein the light source includes one or more light emitting elements, the method comprising:
(a) molding a light transmissive material over the light source and the light detector to thereby encapsulate the light source and the light detector with the light transmissive material;

(b) providing a first portion of an opaque light barrier so that the first portion separates a portion of the light transmissive material molded over and encapsulating the light detector from a portion of the light transmissive material molded over and encapsulating the light source; and (c) providing a second portion of the opaque light barrier, which extends from the first portion of the light barrier in a direction toward the light source a distance greater than an entire gap between the first portion of the light barrier and at least one of the one or more light emitting elements of the light source, so that the second portion of the opaque barrier is located on a portion of an outermost surface of the portion of the light transmissive material molded over and encapsulating the light source, and so that a portion of the second portion of the opaque light barrier extends over at least a portion of at least one of the one or more light emitting elements of the light source.

20. The method of claim 19, further comprising:

(d) providing a third portion of the opaque light barrier, which extends from the first portion of the light barrier a distance greater than an entire gap between the first portion of the light barrier and the light detector in a direction towards the light detector, so that the third portion of the light barrier is located on a portion of an outermost surface of the portion of the light transmissive material molded over and encapsulating the light detector, and so that a portion of the third portion of the light barrier extends over at least a portion of the light detector.

21. The method of claim 20, further comprising:

(e) covering at least a portion of the light source with a lens that is off-centered relative to a center of the light source and laterally located relative to the second portion of the opaque light barrier, such that a center of the lens is offset in a direction away from the first portion of the opaque light barrier, and such that the lens is located on a portion of an outermost surface of the portion of the light transmissive material molded over and encapsulating the light source, or is part of the light transmissive material molded over and encapsulating the light source.

22. The method of claim 19, wherein step (c) includes forming the second portion of the opaque light barrier by painting or otherwise depositing an opaque material in a pattern onto the outermost surface of the portion of the light transmissive material molded over and encapsulating the light source, with portions of the pattern overlapping the outermost surface of the first portion of the light barrier.

23. A method for use with a light sensor device including a light detector and a light source spaced apart from one another, comprising:

(a) molding a light transmissive material over the light source and the light detector to thereby encapsulate the light source and the light detector with the light transmissive material;

(b) providing a first portion of an opaque light barrier so that the first portion separates a portion of the light transmissive material molded over and encapsulating the light detector from a portion of the light transmissive material molded over and encapsulating the light source;

(c) providing a second portion of the opaque light barrier, which extends from the first portion of the light barrier in a direction toward the light source, so that the second portion of the opaque barrier is located on a portion of an outermost surface of the portion of the light transmissive material molded over and encapsulating the light source, and so that a portion of the second portion of the opaque light barrier covers at least a portion of the light source; and (d) covering at least a portion of the light source with a lens that is off-centered relative to a center of the light source and laterally located relative to the second portion of the opaque light barrier, such that a center of the lens is offset in a direction away from the first portion of the opaque light barrier, and such that the lens is located on a portion of an outermost surface of the portion of the light transmissive material molded over and encapsulating the light source, or is part of the light transmissive material molded over and encapsulating the light source.

24. A system, comprising:

an optical sensor;

a driver to selectively drive one or more light emitting elements of the optical sensor;

a processor and/or circuitry to detect proximity of an object, if any, relative to the optical sensor; and a subsystem that is responsive to proximity of an object, if any, relative to the optical sensor, as detected by the processor and/or circuitry;

wherein the optical sensor includes a light source including one or more light emitting elements;

a light detector;

an opaque light barrier including a first portion and a second portion that extends from the first portion;

wherein the first portion of the light barrier is between the light source and the light detector; and wherein the second portion of the light barrier extends from the first portion of the light barrier a distance greater than an entire gap between the first portion of the light barrier and at least one of the one or more light emitting elements of the light source, in a direction towards the light source, such that a portion of the second portion of the light barrier extends over a portion of at least one of the one or more light emitting elements of the light source;

wherein the first portion of the light barrier separates a portion of the light transmissive material molded over and encapsulating the light source from a portion of the light transmissive material molded over and encapsulating the light detector;

wherein the second portion of the light barrier portion covers and is located on a portion of an outermost surface of the portion of the light transmissive material molded over and encapsulating the light source; and wherein the second portion of the light barrier is configured to reduce an amount of specular reflections, if a light transmissive cover plate were placed over the optical sensor device.

25. The system of claim 24, further comprising:

a lens covering at least a portion of the light source, wherein the lens is off-centered relative to a center of the light source, such that a center of the lens is offset in a direction away from the first portion of the opaque light barrier;

wherein the lens is laterally located relative to the second portion of the light barrier; and wherein the lens is located on a portion of an outermost surface of the portion of the light transmissive material molded over and encapsulating the light source, or is part of the light transmissive material molded over and encapsulating the light source.

26. The system of claim 24, wherein the opaque light barrier includes a third portion that extends from the first portion of the light barrier a distance greater than an entire gap between the first portion of the light barrier and the light detector, in a direction towards to the light detector, so that the third portion of the light barrier is located on a portion of an outermost surface of the portion of the light transmissive material molded over and encapsulating the light detector, and so that a portion of the third portion of the light barrier extends over at least a portion of an active area of the light detector.

27. The system of claim 24, wherein the second portion of the light barrier is-painted or otherwise deposited in a pattern onto the outermost surface of the portion of the light transmissive material molded over and encapsulating the light source, with portions of the pattern overlapping the outermost surface of the first portion of the light barrier.

28. An optical sensor device, comprising:
- a light source including one or more light emitting elements;
- a light detector including one or more light detecting elements;
- a light transmissive material molded over and encapsulating the light source and the light detector;
- an opaque light barrier including a first portion and a second portion that extends from the first portion;
- wherein the first portion of the light barrier is between the light source and the light detector; and
- wherein the second portion of the light barrier extends from the first portion of the light barrier, in a direction towards the light source, such that a line normal to a light emitting surface of at least one of the one or more light emitting elements of the light source intersects the second portion of the light barrier;
- wherein the first portion of the light barrier separates a portion of the light transmissive material molded over and encapsulating the light source from a portion of the light transmissive material molded over and encapsulating the light detector;
- wherein the second portion of the light barrier portion covers and is located on a portion of an outermost surface of the portion of the light transmissive material molded over and encapsulating the light source; and
- wherein the second portion of the light barrier is configured to reduce an amount of specular reflections, if a light transmissive cover plate were placed over the optical sensor device.

29. The optical sensor device of claim 28,
- wherein the opaque light barrier includes a third portion that extends from the first portion of the light barrier, in a direction towards the light detector, such that a line normal to a light detecting surface of the light detector intersects the third portion of the light barrier;
- wherein the third portion of the light barrier portion covers and is located on a portion of an outermost surface of the portion of the light transmissive material molded over and encapsulating the light detector; and
- wherein the third portion of the light barrier is configured to reduce an amount of specular reflections that would be detected by the one or more light detecting elements of the light detector, if a light transmissive cover plate were placed over the optical sensor device.

* * * * *

UNITED STATES PATENT AND TRADEMARK OFFICE
CERTIFICATE OF CORRECTION

| | | |
|---|---|---|
| PATENT NO. | : 8,232,541 B2 | |
| APPLICATION NO. | : 12/499723 | |
| DATED | : July 31, 2012 | |
| INVENTOR(S) | : L. Wiese et al. | |

It is certified that error appears in the above-identified patent and that said Letters Patent is hereby corrected as shown below:

On Title Page 2, References Cited (56), Other Publications, Column 2, line 25, ".Com http://" should be -- .Com, http:// --.

At Column 18, line 60 (claim 19, line 1), "include" should be -- including --.

At Column 21, line 5 (claim 26, line 5), please delete "to" after towards.

At Column 21, line 13 (claim 27, line 2), please delete "-" after is.

Signed and Sealed this
Twenty-seventh Day of November, 2012

David J. Kappos
*Director of the United States Patent and Trademark Office*